(12) United States Patent
Nakano

(10) Patent No.: US 9,219,127 B2
(45) Date of Patent: *Dec. 22, 2015

(54) SIC FIELD EFFECT TRANSISTOR

(75) Inventor: Yuki Nakano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/518,650

(22) PCT Filed: Dec. 24, 2010

(86) PCT No.: PCT/JP2010/073398
§ 371 (c)(1),
(2), (4) Date: Jun. 22, 2012

(87) PCT Pub. No.: WO2011/078346
PCT Pub. Date: Jun. 30, 2011

(65) Prior Publication Data
US 2012/0261676 A1    Oct. 18, 2012

(30) Foreign Application Priority Data
Dec. 24, 2009   (JP) .................................. 2009-293363

(51) Int. Cl.
*H01L 29/78*     (2006.01)
*H01L 29/66*     (2006.01)
*H01L 29/165*    (2006.01)
(Continued)

(52) U.S. Cl.
CPC ........ *H01L 29/66068* (2013.01); *H01L 29/165* (2013.01); *H01L 29/41741* (2013.01); *H01L 29/41766* (2013.01); *H01L 29/7803* (2013.01); *H01L 29/7806* (2013.01); *H01L 29/7813* (2013.01); *H01L 29/1608* (2013.01); *H01L 29/43* (2013.01); *H01L 29/47* (2013.01); *H01L 29/8618* (2013.01); *H01L 29/872* (2013.01)

(58) Field of Classification Search
CPC ..................... H01L 29/7813; H01L 29/41766; H01L 29/4236; H01L 29/7802; H01L 29/1608
USPC ..................... 257/330, E29.257, E29.262, 77; 438/270
See application file for complete search history.

(56) References Cited

U.S. PATENT DOCUMENTS 5,466,971 A    11/1995 Higuchi
5,831,288 A    11/1998 Singh et al.
(Continued)

FOREIGN PATENT DOCUMENTS

CN    101174569 A    5/2008
JP    60-123060 A    7/1985
(Continued)

*Primary Examiner* — Jerome Jackson, Jr.
(74) *Attorney, Agent, or Firm* — Rabin & Berdo, P.C.

(57) ABSTRACT

A SiC field effect transistor includes: a SiC semiconductor layer; and a MIS transistor structure including a first conductivity type source region in the semiconductor layer, a second conductivity type body region in the semiconductor layer in contact with the source region, a first conductivity type drift region in the semiconductor layer in contact with the body region, a gate electrode opposed to the body region with a gate insulation film interposed between the electrode and the body region for forming a channel in the body region to cause electric current to flow between the drift region and the source region, and a barrier forming layer in contact with the drift region to form a junction barrier by the contact with the drift region, the junction barrier being lower than a diffusion potential of a body diode defined by a junction between the body region and the drift region.

19 Claims, 34 Drawing Sheets

(51) Int. Cl.
*H01L 29/417* (2006.01)
*H01L 29/16* (2006.01)
*H01L 29/43* (2006.01)
*H01L 29/47* (2006.01)
*H01L 29/861* (2006.01)
*H01L 29/872* (2006.01)

(56) References Cited

U.S. PATENT DOCUMENTS

| | | |
|---|---|---|
| 6,228,720 B1 | 5/2001 | Kitabatake et al. |
| 6,342,709 B1 | 1/2002 | Sugawara et al. |
| 6,362,495 B1 | 3/2002 | Schoen et al. |
| 6,599,644 B1 | 7/2003 | Zekentes et al. |
| 6,649,973 B2 | 11/2003 | Takaishi |
| 6,822,288 B2 * | 11/2004 | Hshieh et al. .................. 257/330 |
| 7,645,658 B2 | 1/2010 | Nakamura et al. |
| 7,714,352 B2 | 5/2010 | Shimoida et al. |
| 7,824,995 B2 | 11/2010 | Endo et al. |
| 8,035,112 B1 | 10/2011 | Cooper et al. |
| 8,044,434 B2 | 10/2011 | Ohta et al. |
| 8,415,250 B2 | 4/2013 | Alptekin et al. |
| 8,487,318 B2 | 7/2013 | Nakano |
| 8,623,752 B2 | 1/2014 | Fujikawa et al. |
| 2002/0132473 A1 | 9/2002 | Chiang et al. |
| 2002/0175383 A1 | 11/2002 | Kocon et al. |
| 2004/0145011 A1 | 7/2004 | Hsu et al. |
| 2004/0217358 A1 | 11/2004 | Kaneko |
| 2005/0012143 A1 | 1/2005 | Tanaka et al. |
| 2005/0045892 A1 | 3/2005 | Hayashi et al. |
| 2005/0062048 A1 | 3/2005 | Hayashi et al. |
| 2005/0077569 A1 | 4/2005 | Yamashita et al. |
| 2005/0133794 A1 | 6/2005 | Hayashi et al. |
| 2005/0167742 A1 * | 8/2005 | Challa et al. .................. 257/328 |
| 2005/0173739 A1 | 8/2005 | Kusumoto et al. |
| 2005/0199873 A1 | 9/2005 | Tanaka et al. |
| 2005/0199953 A1 | 9/2005 | Kawamura et al. |
| 2005/0218472 A1 | 10/2005 | Okada et al. |
| 2006/0267090 A1 | 11/2006 | Sapp et al. |
| 2006/0273382 A1 | 12/2006 | Hshieh |
| 2007/0007537 A1 * | 1/2007 | Ogura et al. .................. 257/77 |
| 2007/0034901 A1 | 2/2007 | Lui et al. |
| 2007/0138545 A1 | 6/2007 | Lin et al. |
| 2007/0138548 A1 | 6/2007 | Kocon et al. |
| 2007/0181886 A1 | 8/2007 | Shimoida et al. |
| 2007/0241338 A1 | 10/2007 | Yamamoto et al. |
| 2007/0262324 A1 | 11/2007 | Kaneko |
| 2008/0029812 A1 | 2/2008 | Bhalla |
| 2008/0081422 A1 | 4/2008 | Kobayashi et al. |
| 2008/0099768 A1 | 5/2008 | Scarsbrook et al. |
| 2008/0102585 A1 | 5/2008 | Nakamura et al. |
| 2008/0197361 A1 | 8/2008 | Ueno |
| 2008/0203402 A1 | 8/2008 | Endo et al. |
| 2008/0246086 A1 * | 10/2008 | Korec et al. .................. 257/343 |
| 2009/0032821 A1 | 2/2009 | Onose et al. |
| 2009/0066589 A1 * | 3/2009 | Yamazaki et al. ............ 343/702 |
| 2009/0072301 A1 | 3/2009 | Bhalla et al. |
| 2009/0140262 A1 | 6/2009 | Ohki et al. |
| 2009/0140326 A1 | 6/2009 | Konstantinov et al. |
| 2009/0140327 A1 | 6/2009 | Hirao et al. |
| 2009/0179264 A1 | 7/2009 | Korec et al. |
| 2009/0212359 A1 | 8/2009 | Hsieh |
| 2009/0272982 A1 | 11/2009 | Nakamura et al. |
| 2009/0283776 A1 | 11/2009 | Iwamuro |
| 2009/0315106 A1 | 12/2009 | Hsieh |
| 2009/0315107 A1 | 12/2009 | Hsieh |
| 2010/0006861 A1 | 1/2010 | Yamamoto et al. |
| 2010/0025730 A1 | 2/2010 | Heikman et al. |
| 2010/0052014 A1 | 3/2010 | Matsushita |
| 2010/0102331 A1 | 4/2010 | Fujikawa et al. |
| 2010/0193796 A1 | 8/2010 | Nakano |
| 2010/0193799 A1 | 8/2010 | Nakano et al. |
| 2010/0224884 A1 | 9/2010 | Seki et al. |
| 2010/0224886 A1 | 9/2010 | Iwamura |
| 2011/0042727 A1 | 2/2011 | Pan et al. |
| 2011/0175111 A1 | 7/2011 | Harada et al. |
| 2011/0207321 A1 | 8/2011 | Fujiwara et al. |
| 2012/0012861 A1 | 1/2012 | Nakano et al. |
| 2012/0049202 A1 | 3/2012 | Nakano |
| 2013/0026568 A1 | 1/2013 | Bhalla |
| 2013/0119483 A1 | 5/2013 | Alptekin et al. |
| 2013/0234159 A1 | 9/2013 | Tsuchiya |
| 2013/0285072 A1 | 10/2013 | Iwamuro |
| 2014/0015019 A1 | 1/2014 | Okamoto et al. |

FOREIGN PATENT DOCUMENTS

| | | |
|---|---|---|
| JP | 60-169169 A | 9/1985 |
| JP | 63-229852 A | 9/1988 |
| JP | 3-163832 A | 7/1991 |
| JP | 06-077163 A | 3/1994 |
| JP | 10-098188 A | 4/1998 |
| JP | 2000-312003 A | 11/2000 |
| JP | 2001-119025 | 4/2001 |
| JP | 2003-318388 | 11/2003 |
| JP | 2004-031471 | 1/2004 |
| JP | 2005-101255 | 4/2005 |
| JP | 2005-183563 A | 7/2005 |
| JP | 2005-285913 A | 10/2005 |
| JP | 2006-066770 | 3/2006 |
| JP | 2006-332358 | 12/2006 |
| JP | 2007-214355 A | 8/2007 |
| JP | 2007-258465 A | 10/2007 |
| JP | 2008-017237 A | 1/2008 |
| JP | 2008-117923 A | 5/2008 |
| JP | 2008-530800 A | 8/2008 |
| JP | 2008-244455 | 10/2008 |
| JP | 2009-088326 A | 4/2009 |
| JP | 2009-135360 A | 6/2009 |
| JP | 2010-171417 A | 8/2010 |
| WO | WO-2006086636 A2 | 8/2006 |

* cited by examiner

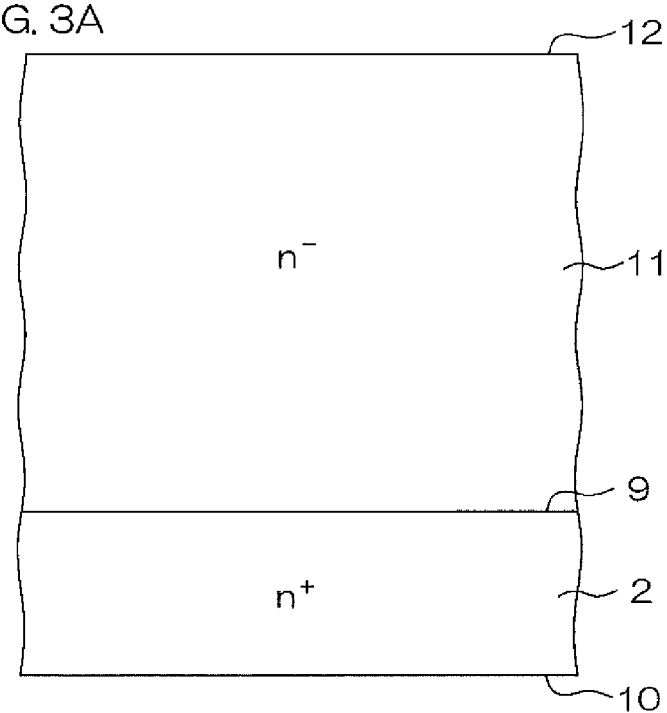
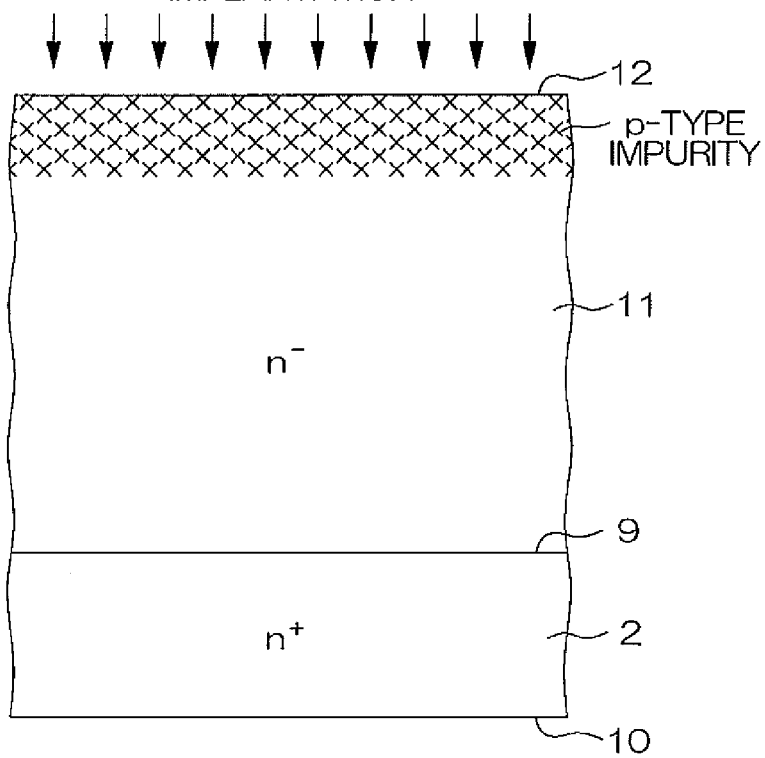

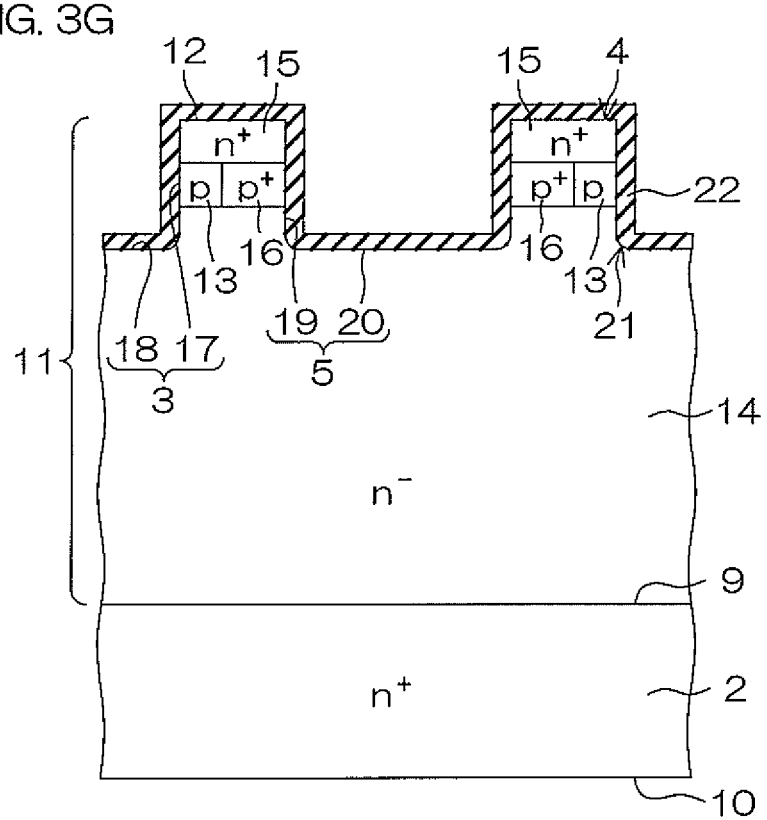

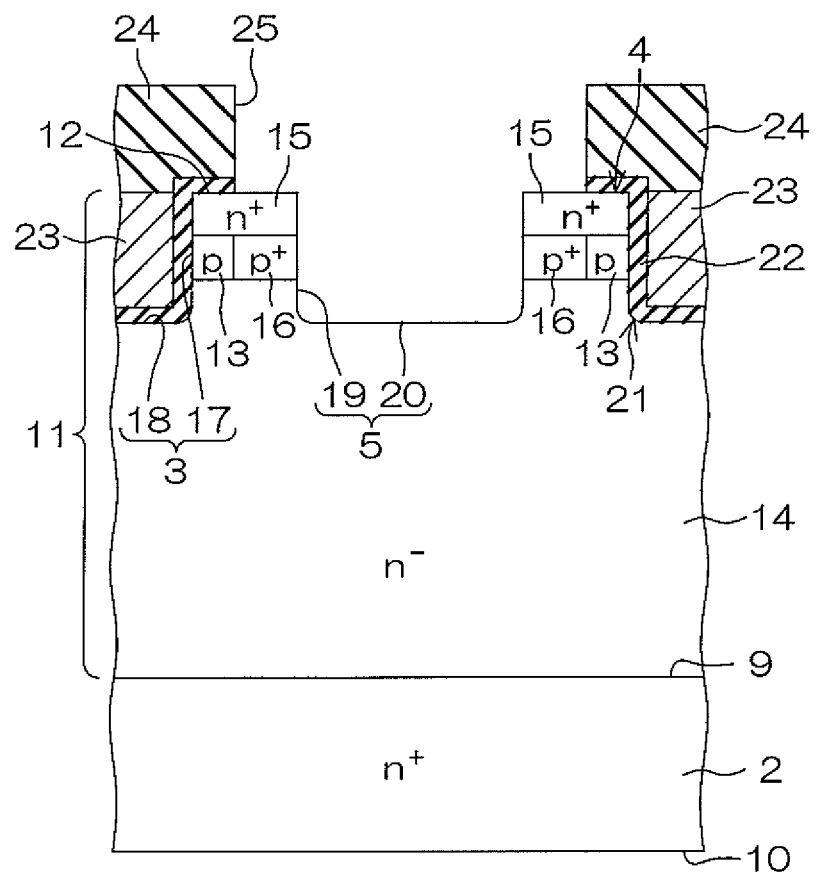

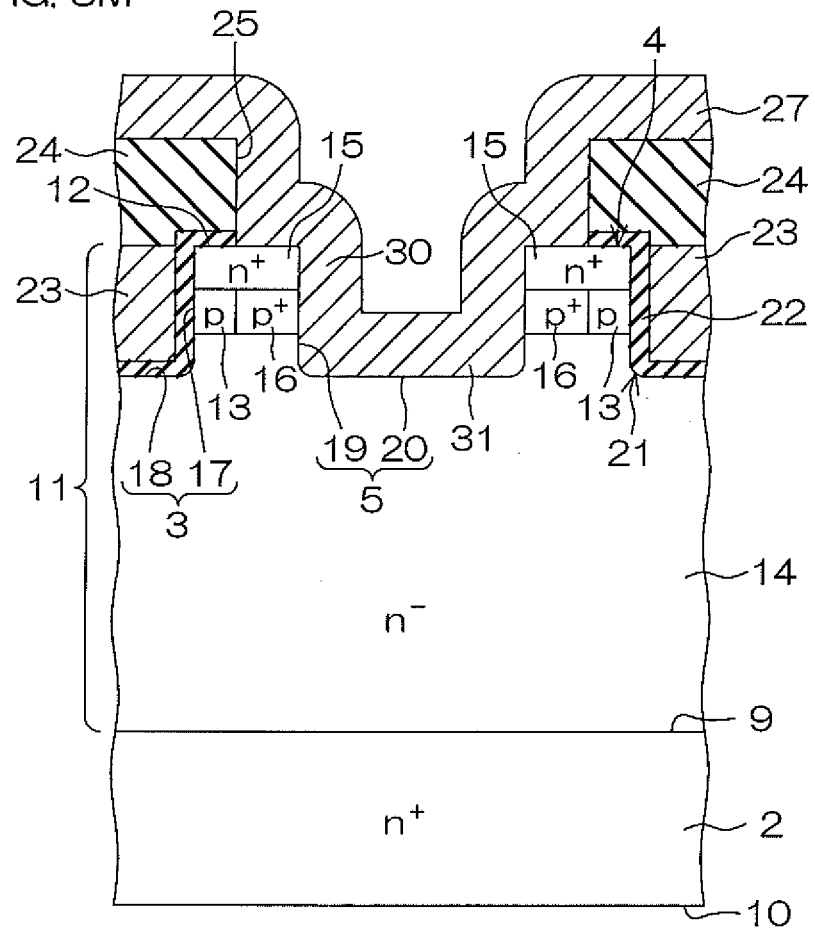

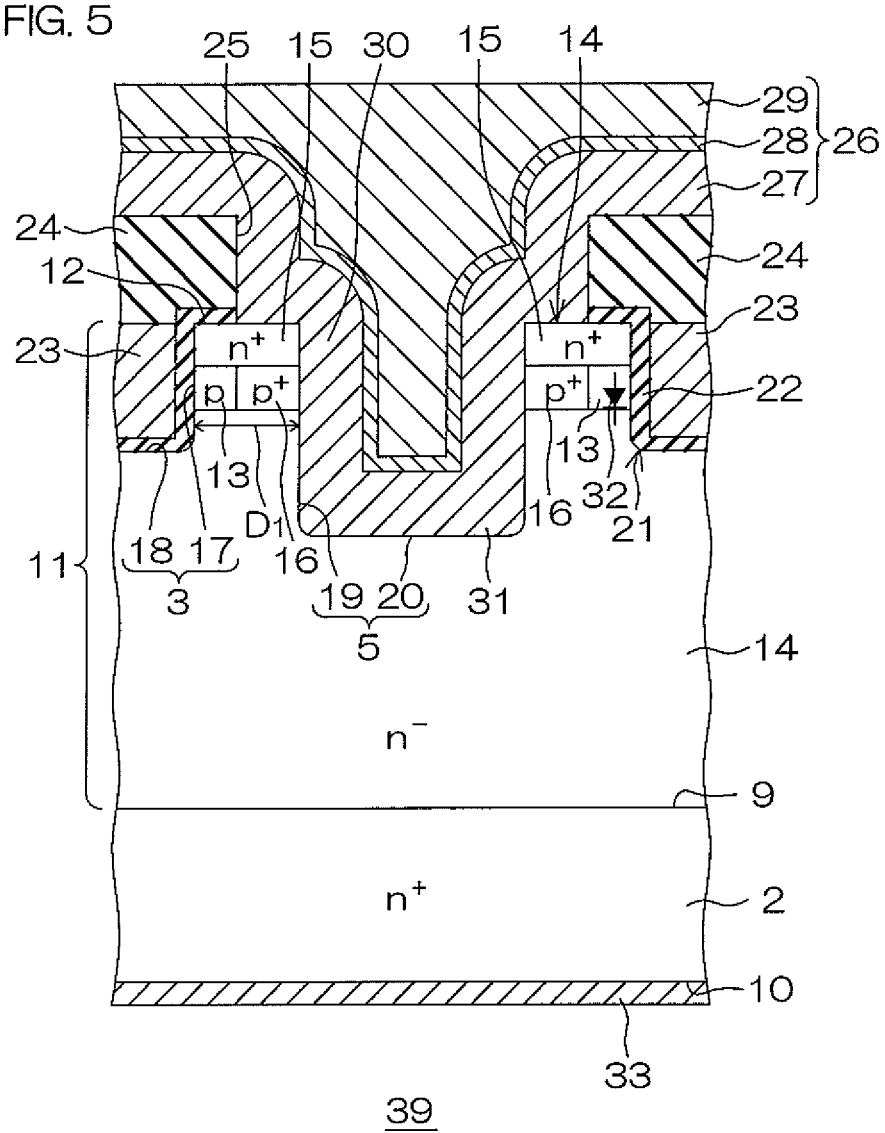

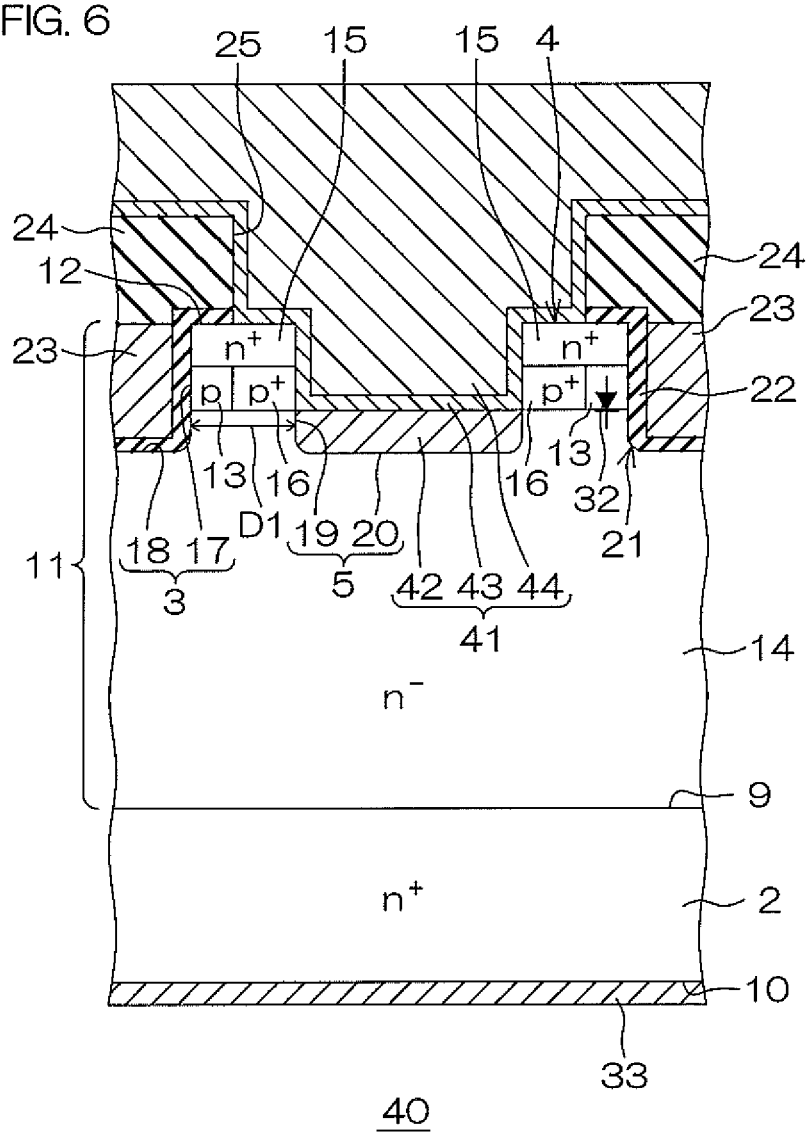

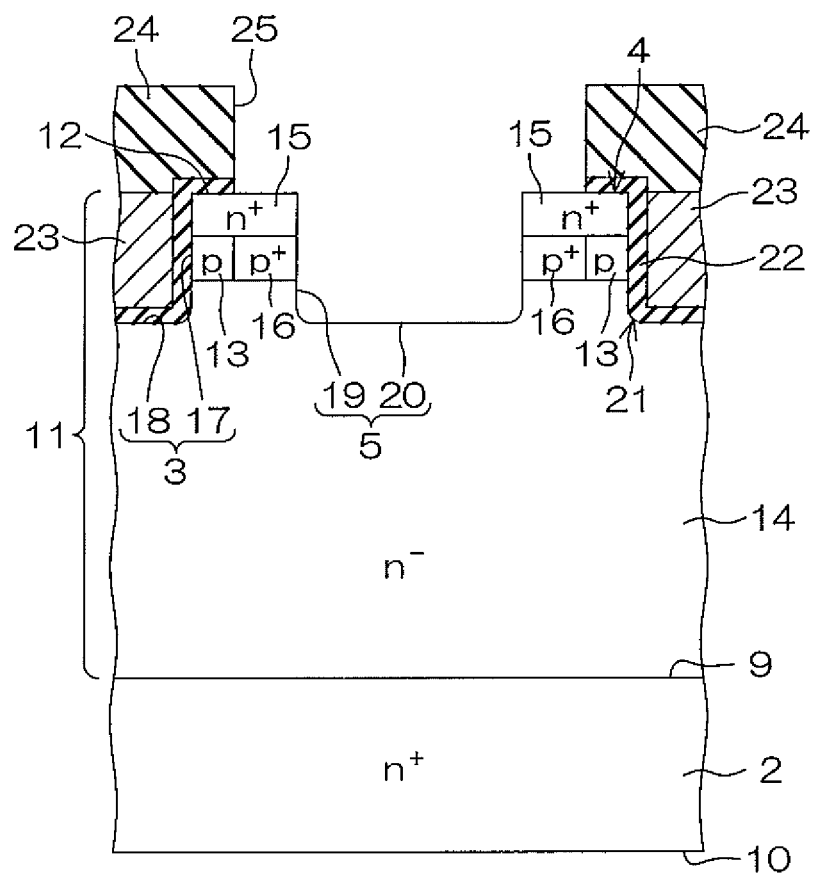

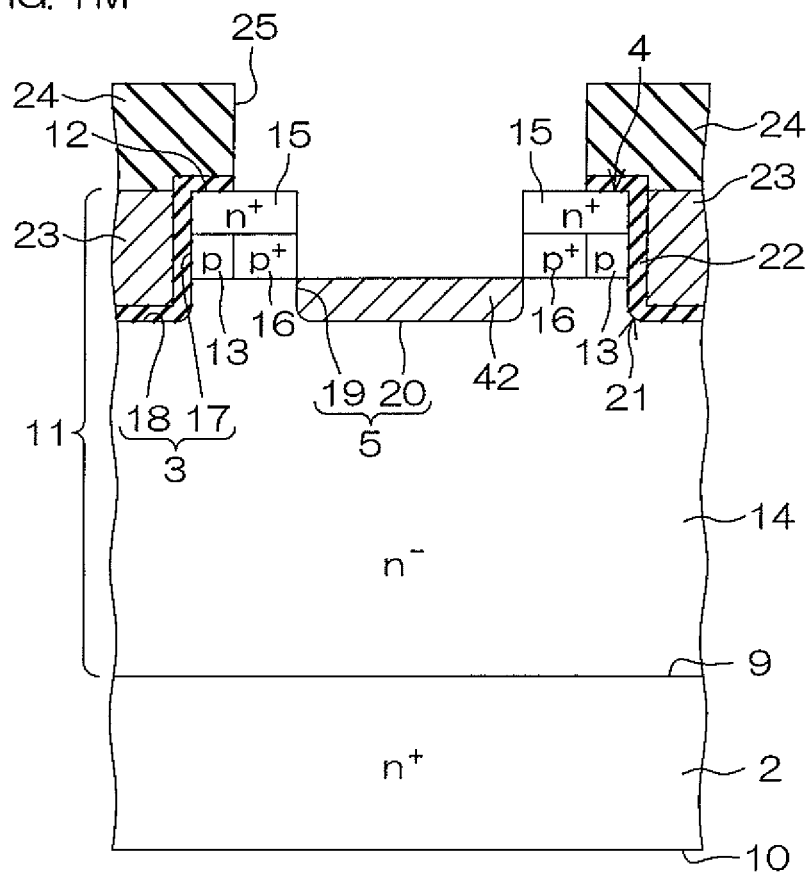

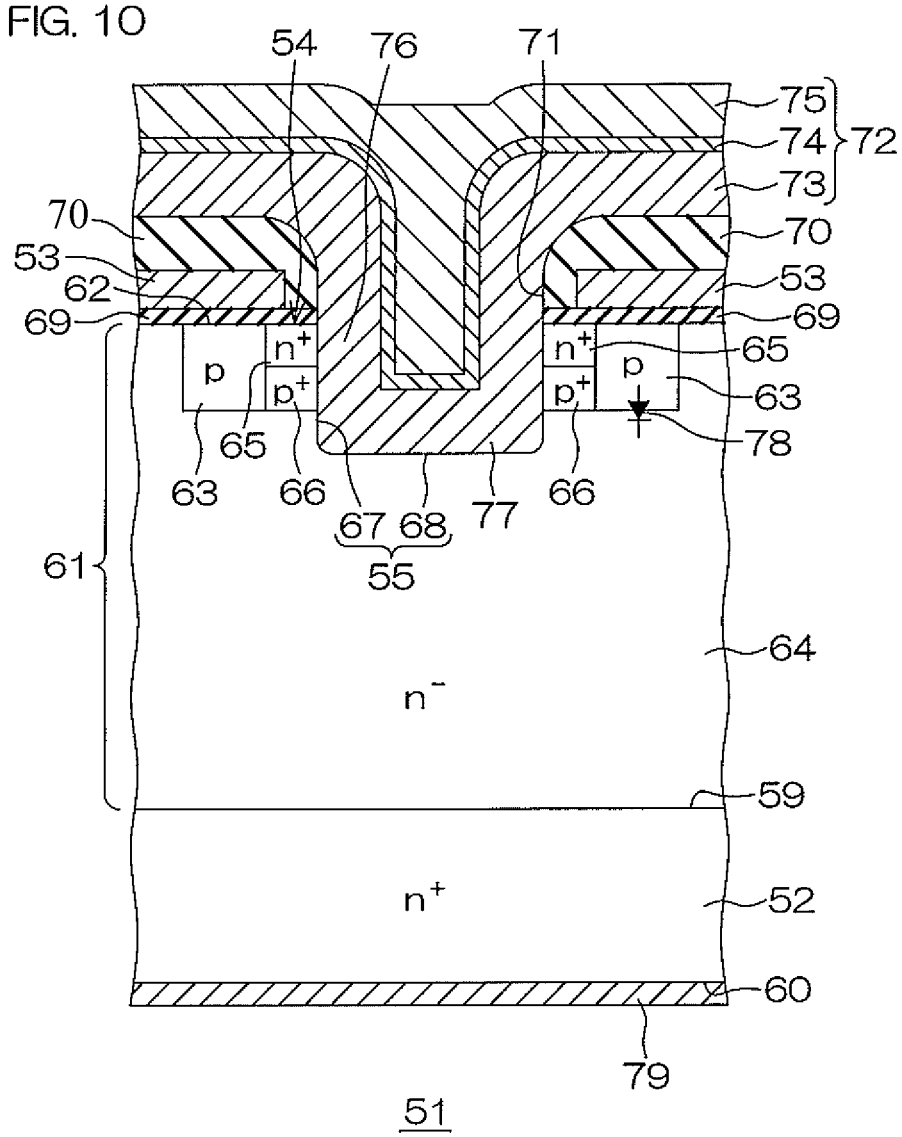

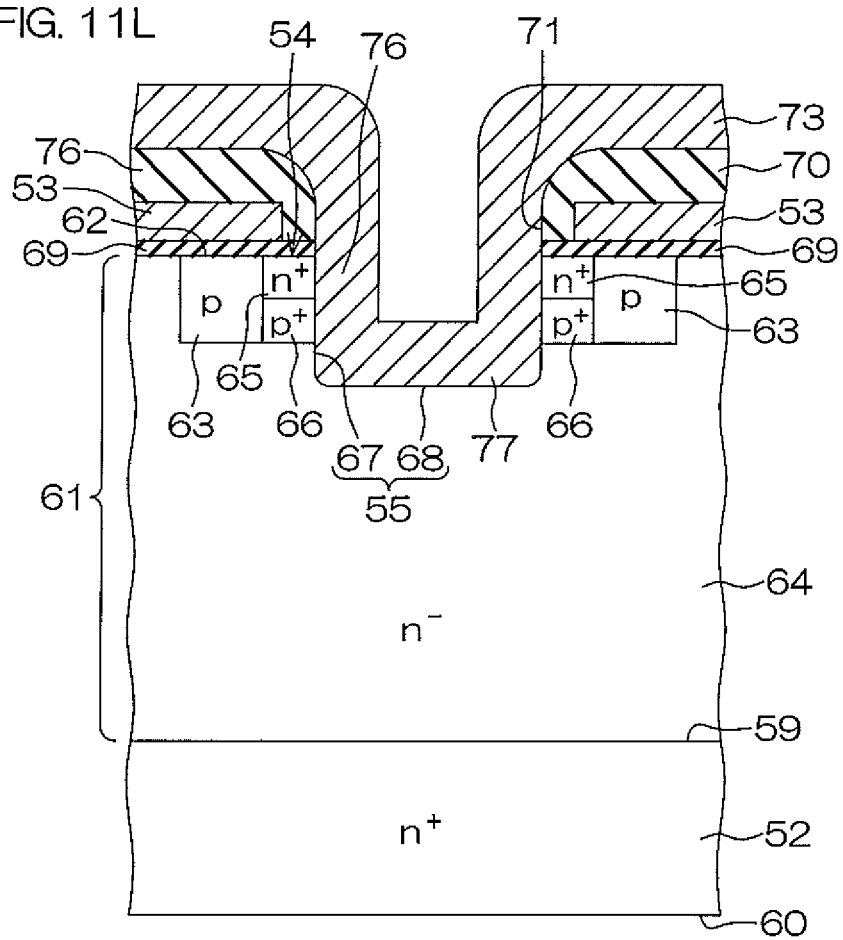

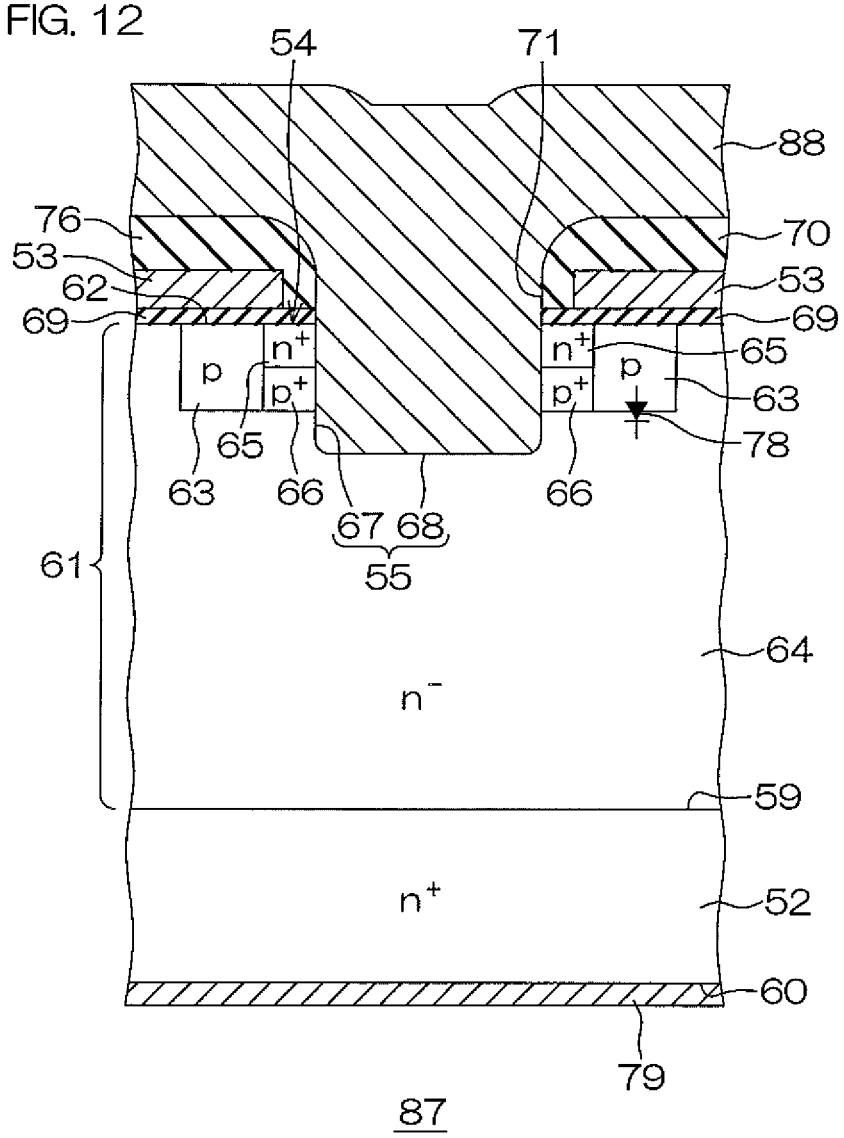

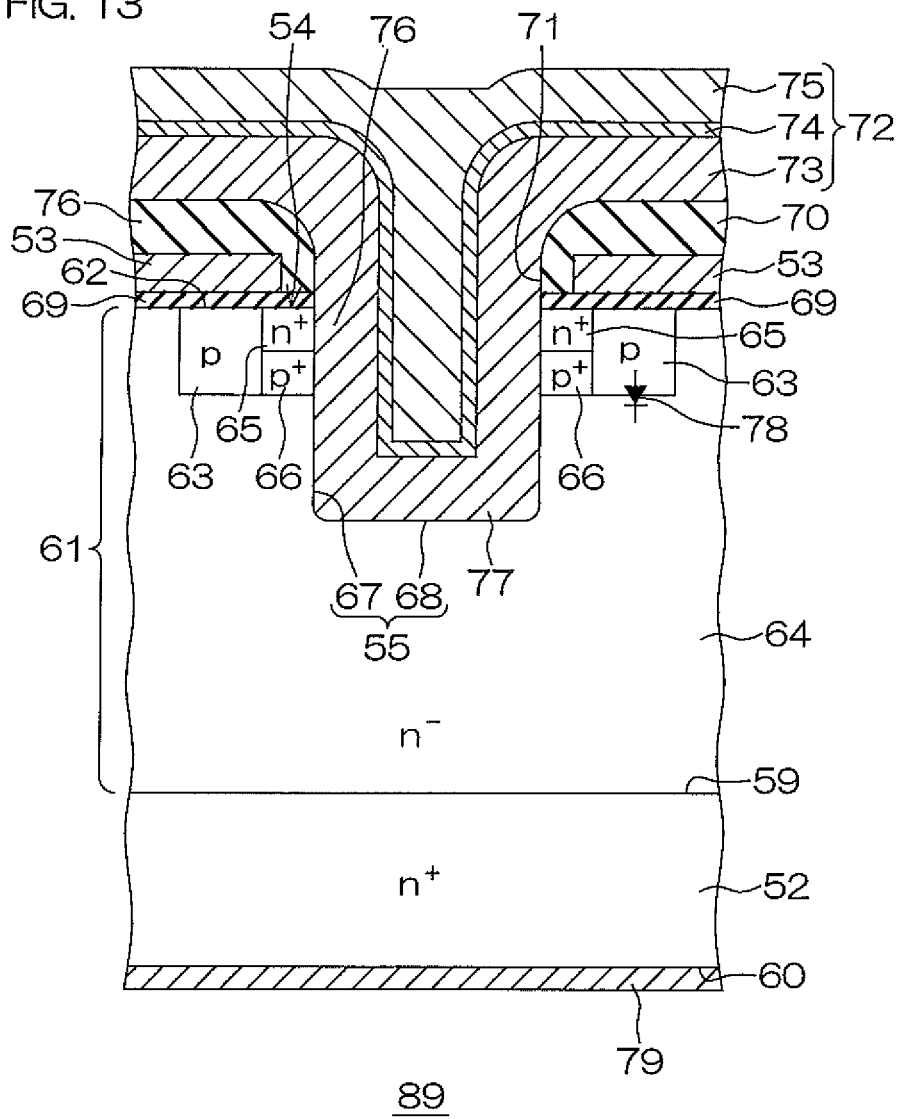

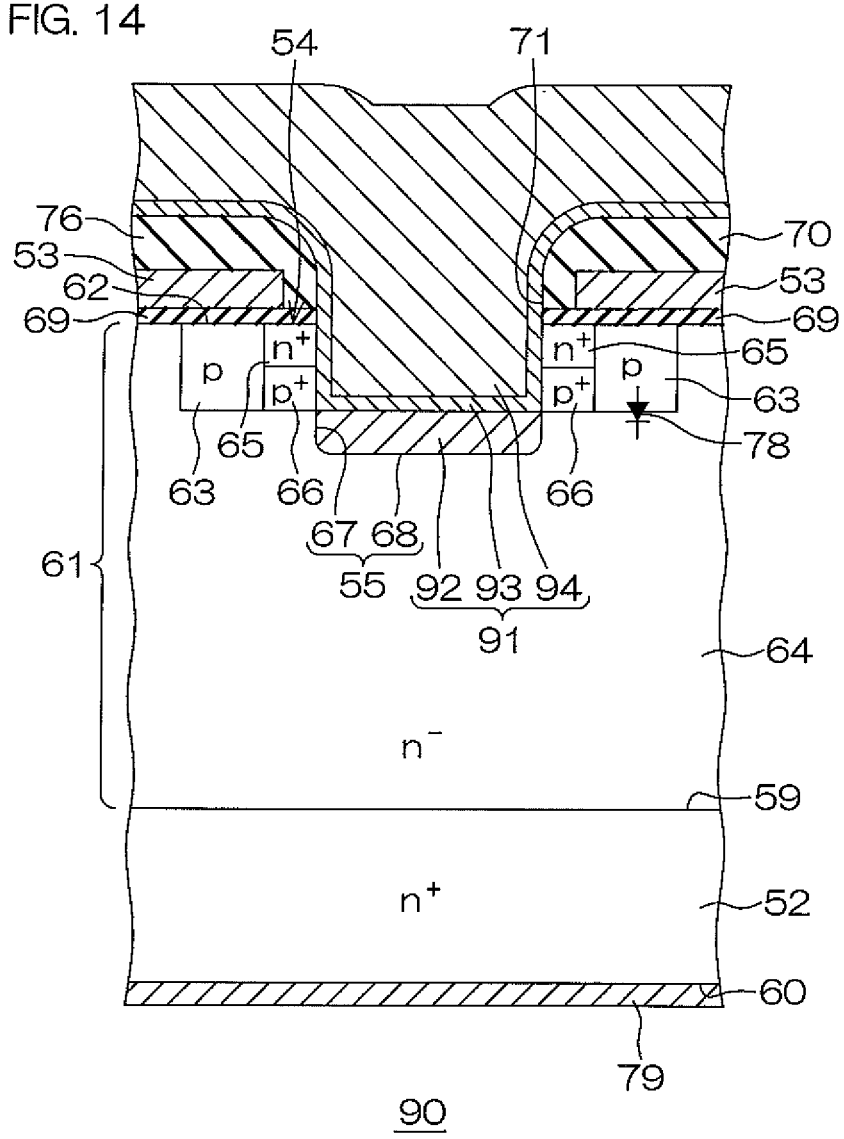

SIC FIELD EFFECT TRANSISTOR

TECHNICAL FIELD

The present invention relates to a SiC field effect transistor.

BACKGROUND ART

In recent years, SiC (silicon carbide) semiconductors which permit an operation with higher breakdown voltage, higher current and lower ON resistance than Si semiconductors are attractive as power device materials alternative to Si semiconductors (see, for example, Patent Literature 1).

SiC power devices are used, for example, as switching devices for various invertor circuits to be incorporated in motor control systems, power conversion systems and the like.

In a motor control circuit or the like, such a SiC power device (switching device) is designed so that, when current flowing through a motor coil is cut off by turning off the SiC power device, a counter electromotive voltage generated in the motor coil due to electromagnetic induction of the motor coil is consumed by a diode.

More specifically, current attributable to the counter electromotive voltage is allowed to flow into the motor coil as return current by the rectification function of a parasitic diode (body diode) defined by a pn junction between a p-type body region and an n-type drift region present in the device. This prevents a high counter electromotive voltage from being applied to the switching device.

CITATION LIST

Patent Literature

Patent Literature 1: JP-2007-258465-A

SUMMARY OF INVENTION

Technical Problem

However, when the current flows with holes migrating from the p-type body region of the pn body diode to the n-type drift region, a multiplicity of carrier electrons are liable to be recombined with the holes migrating from the p-type body region in the n-type drift region.

This may result in extended SiC crystal defects due to energy generated by the recombination, thereby increasing the ON resistance when the SiC power device performs a switching operation.

It is an object of the present invention to provide a SiC field effect transistor which has a proper breakdown voltage and is substantially free from the increase in ON resistance.

Solution to Problem

The inventive SiC field effect transistor to achieve the aforementioned object includes: a SiC semiconductor layer; and a "Metal Insulator Semiconductor" (hereinafter "MIS") transistor structure including a source region of a first conductivity type provided in the SiC semiconductor layer, a body region of a second conductivity type provided in the SiC semiconductor layer in contact with the source region, a drift region of the first conductivity type provided in the SiC semiconductor layer in contact with the body region, and a gate electrode opposed to the body region with a gate insulation film interposed between the gate electrode and the body region for forming a channel in the body region to cause electric current to flow between the drift region and the source region; wherein the MIS transistor structure further includes a barrier forming layer provided in contact with the drift region to form a junction bather by the contact with the drift region, the junction barrier being lower than a diffusion potential of a body diode defined by a junction (pn junction) between the body region and the drift region.

The SiC field effect transistor is used, for example, as a switching device. In this case, current flowing through a load is turned on and off by turning on and off a gate voltage while applying a voltage between the source region and the drift region with the drift region kept at a positive potential.

Where the load is an inductive load, a counter electromotive voltage is generated in the load when the current flowing through the load is cut off (i.e., when the gate voltage is turned off). The counter electromotive voltage is liable to be applied between the source region and the drift region with the source region kept at a positive potential.

In this case, the current preferentially flows through the junction between the barrier forming layer and the drift region to reduce or eliminate the current flowing through the body diode. Thus, the current flowing through the SiC field effect transistor is caused to flow into the load as return current.

During an OFF period, the current flows through the barrier forming layer, so that the carriers hardly migrate between the body region and the drift region. This substantially prevents the recombination of the holes and the electrons in the drift region. As a result, the extension of the SiC crystal defects can be suppressed to suppress the increase in the ON resistance of the transistor.

The barrier forming layer may be a layer which forms a hetero junction or a Schottky junction with respect to the SiC drift region to form a junction barrier lower than the diffusion potential of the body diode with respect to the drift region. Where the hetero junction is formed, for example, the barrier forming layer is preferably made of polysilicon. Where the Schottky junction is formed, the barrier forming layer is preferably made of a material selected from the group consisting of Ni, Ti, Mo, W and Pt.

The MIS transistor structure includes a vertical MIS transistor structure in which the source region and the drift region are spaced from each other vertically and perpendicularly to a major surface of the SiC semiconductor layer with the body region interposed therebetween. The vertical MIS transistor structure may further include a source trench extending from the major surface of the SiC semiconductor layer to the drift region through the source region and the body region, and a source electrode provided in contact with the source region, the body region and the drift region in the source trench with the barrier forming layer being disposed in a portion thereof contacting the drift region.

The SiC field effect transistor including the vertical MIS transistor structure facilitates the flow of higher current, and permits higher breakdown voltage and lower ON resistance.

Further, the source trench simultaneously exposes both the source region and the drift region, so that the source electrode provided in the source trench can be brought into contact with both the source region and the drift region. Thus, the source electrode forms an ohmic junction with respect to the source region to form a junction barrier lower than the diffusion potential of the body diode with respect to the drift region. This makes it possible to form the two junctions in a source electrode forming step in a SiC field effect transistor production process.

Where the MIS transistor structure includes the vertical MIS transistor structure, the source electrode preferably includes a polysilicon layer provided in contact with all of the source region, the body region and the drift region, and the polysilicon layer preferably includes a first portion which forms an ohmic junction with respect to the source region, and a second portion which serves as the barrier forming layer to form a hetero junction with respect to the drift region.

Since the layer provided in contact with the source region and the drift region is made of polysilicon, it is possible to form the ohmic junction between the first portion of the polysilicon layer and the higher concentration source region and to form the hetero junction between the second portion of the polysilicon layer and the lower concentration drift region without precisely controlling an annealing temperature in the production process. Without the need for the precise control of the annealing temperature, the two junctions can be simultaneously formed by the deposition of the polysilicon layer and the annealing.

Since polysilicon ensures excellent step coverage, the polysilicon layer of the source electrode can be properly brought into contact with a portion of the source region exposed in a side surface of the source trench. As a result, the connection reliability of the source electrode can be improved.

The body region preferably has an impurity concentration of not less than $1 \times 10^{16}$ cm$^{-3}$. Where the impurity concentration of the body region is not less than $1 \times 10^{16}$ cm$^{-3}$, the contact resistance between the body region and the polysilicon layer can be reduced, thereby suppressing a voltage drop in the junction between the polysilicon layer and the body region. Since the sheet resistance of the body region can be reduced, the operation of a parasitic bipolar transistor (a bipolar transistor including the source region, the body region and the drift region) can be prevented. As a result, the transistor operation can be properly performed.

The source region preferably has an impurity concentration of not less than $1 \times 10^{18}$ cm$^{-3}$. Where the impurity concentration of the source region is not less than $1 \times 10^{18}$ cm$^{-3}$, the contact resistance between the source region and the polysilicon layer (first portion) and the sheet resistance of the source region can be reduced, thereby reducing the ON resistance of the transistor. As a result, the transistor operation can be properly performed.

The source electrode may further include a metal layer provided on the polysilicon layer, and the metal layer may include a Ti-containing layer provided in a portion thereof contacting the polysilicon layer.

A Ti-containing material has excellent adhesiveness to both the polysilicon and the metal (metal material). With the provision of the Ti-containing layer between the polysilicon layer and the metal layer, the adhesion between the polysilicon layer and the metal layer can be improved. As a result, the connection reliability of the source electrode can be improved.

A portion of the source electrode provided in contact with the source region, the body region and the drift region is not necessarily required to be entirely made of polysilicon, but may include a polysilicon layer provided in contact with the drift layer and a metal layer provided on the polysilicon layer in contact with the source region. The metal layer may form an ohmic junction with respect to the source region, and the polysilicon layer may serve as the barrier forming layer to form a hetero junction with respect to the drift region.

Alternatively, the source electrode may include a metal layer provided in contact with all of the source region, the body region and the drift region, and the metal layer may include a first portion which forms an ohmic junction with respect to the source region, and a second portion which serves as the barrier forming layer to form a Schottky junction with respect to the drift region. In this case, the metal layer is preferably made of a material, for example, selected from the group consisting of Ni, Ti, Mo, W and Pt as described above.

Further, the polysilicon layer is preferably doped with at least one impurity selected from the group consisting of N, P, As, Al and B.

That is, the polysilicon layer preferably contains at least one of N, P and As as n-type impurities and Al and B as p-type impurities. The polysilicon layer preferably has an impurity concentration of not less than $1 \times 10^{15}$ cm$^{-3}$. This improves the electrical conductivity of the polysilicon layer.

The polysilicon layer further preferably contains a p-type impurity. Where the polysilicon layer contains the p-type impurity in an impurity concentration of not less than $1 \times 10^{15}$ cm$^{-3}$, a sufficiently high junction barrier can be provided between the polysilicon layer and the body region provided in contact with each other. As a result, leak current occurring between the polysilicon layer and the drift region can be suppressed.

The metal layer preferably has a structure including a Ti sublayer, a TiN sublayer and an Al sublayer stacked in this order from the polysilicon layer.

As described above, Al is used as a p-type impurity for imparting the polysilicon layer with electrical conductivity. Unless Al is incorporated in a proper amount into the polysilicon layer, the resistance value of the polysilicon layer will become unstable.

Therefore, the structure including the Ti sublayer, the TiN sublayer and the Al sublayer stacked in this order from the polysilicon layer serves as a barrier layer for prevention of diffusion of Al from the Al sublayer into the polysilicon layer. The impurity concentration of the polysilicon layer can be thus stabilized, because an excess amount of Al is not diffused into the polysilicon layer. As a result, the resistance value of the polysilicon layer can be stabilized.

The metal layer preferably includes a Mo sublayer. Since Mo has a higher melting point, the Mo sublayer included in the metal layer substantially prevents the metal layer from being melted to be damaged by heat generated when higher current flows through the source electrode.

The vertical MIS transistor structure may further include a gate trench extending from the major surface of the SiC semiconductor layer to the drift region through the source region and the body region, and may include a trench gate type structure in which the gate insulation film is disposed on a side surface of the gate trench and the gate electrode is opposed to the body region with the gate insulation film interposed between the gate electrode and the body region.

Where the vertical MIS transistor structure is the trench gate type structure, the functions and the effects described above can be provided and, at the same time, a bottom corner portion of the gate trench is substantially prevented from having dense equipotential line distribution. As a result, the electric field applied to the bottom corner portion of the gate trench can be alleviated, thereby suppressing dielectric breakdown of a portion of the gate insulation film present on the bottom of the gate trench.

Further, the source trench preferably has a greater depth than the gate trench. Thus, the electric field applied to the bottom corner portion of the gate trench can be further alleviated.

A distance between the side surface of the source trench and the side surface of the gate trench is preferably 0.5 μm to 3 μm.

Where the distance between the side surface of the source trench and the side surface of the gate trench is within the aforementioned range, the increase in the ON resistance can be suppressed during the operation of the transistor, thereby suppressing the electric field applied to the bottom of the gate trench.

The vertical MIS transistor structure may include a planar gate type structure in which the gate insulation film is disposed on the major surface of the SiC semiconductor layer and the gate electrode is opposed to the body region with the gate insulation film interposed between the gate electrode and the body region.

BRIEF DESCRIPTION OF DRAWINGS

FIG. 3A is a schematic sectional view for explaining a method of producing the field effect transistor shown in FIG. 2.

FIG. 3B is a diagram showing a step subsequent to the step of FIG. 3A.

FIG. 3G is a diagram showing a step subsequent to the step of FIG. 3F.

FIG. 3L is a diagram showing a step subsequent to the step of FIG. 3K.

FIG. 3M is a diagram showing a step subsequent to the step of FIG. 3L.

FIG. 5 is a schematic sectional view for explaining a second modification of the field effect transistor shown in FIG. 2.

FIG. 6 is a schematic sectional view for explaining a third modification of the field effect transistor shown in FIG. 2.

FIG. 7L is a diagram showing a step subsequent to the step of FIG. 7K.

FIG. 7M is a diagram showing a step subsequent to the step of FIG. 7L.

FIG. 10 is a schematic sectional view of the field effect transistor taken along a section line X-X in FIG. 9B according to the second embodiment of the present invention.

FIG. 11L is a diagram showing a step subsequent to the step of FIG. 11K.

FIG. 12 is a schematic sectional view for explaining a first modification of the field effect transistor shown in FIG. 10.

FIG. 13 is a schematic sectional view for explaining a second modification of the field effect transistor shown in FIG. 10.

FIG. 14 is a schematic sectional view for explaining a third modification of the field effect transistor shown in FIG. 10.

EMBODIMENTS OF THE INVENTION

Embodiments of the present invention will hereinafter be described in detail with reference to the attached drawings.

Figure 1B:
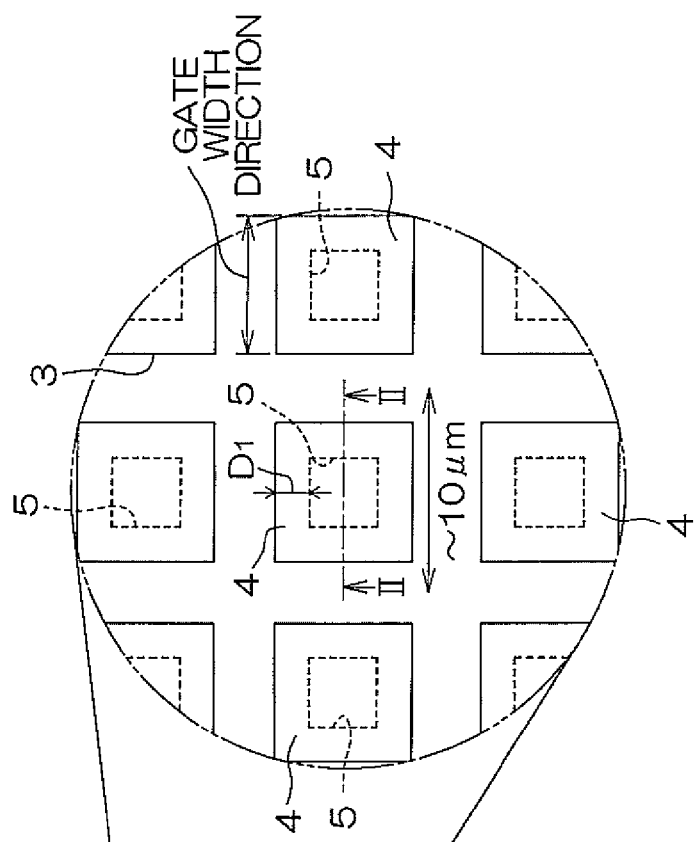
FIGS. 1A and 1B are schematic plan views of a field effect transistor according to a first embodiment of the present invention, particularly, FIG. 1A being an overall view and FIG. 1B being an enlarged internal view.
Figure 1A:
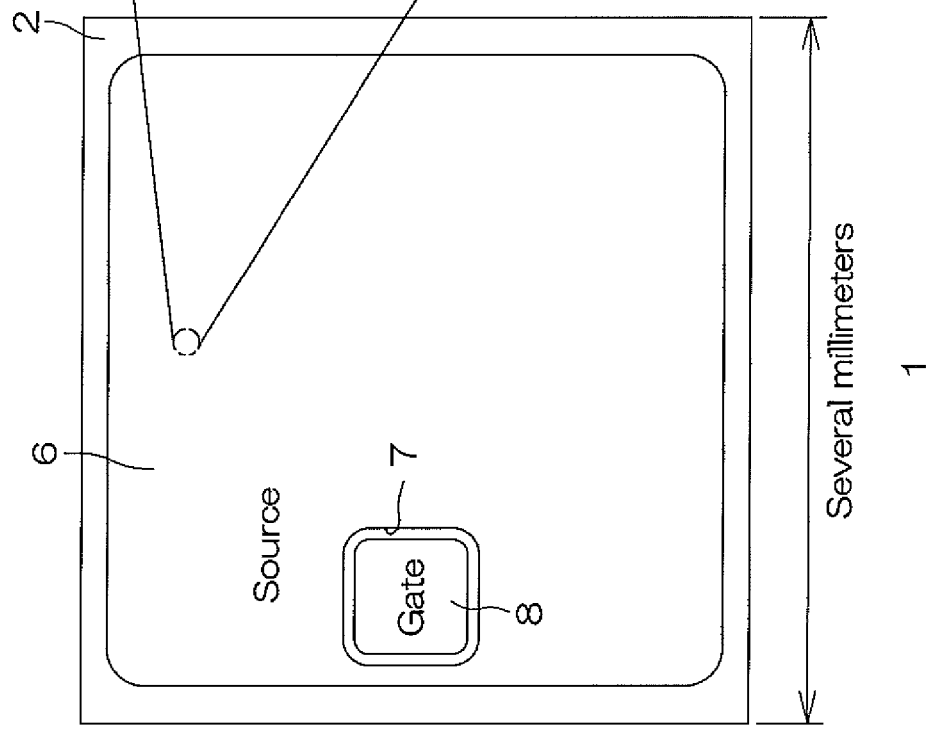

FIGS. 1A and 1B are schematic plan views of a field effect transistor according to a first embodiment of the present invention. Particularly, FIG. 1A is an overall view, and FIG. 1B is an enlarged internal view.

The field effect transistor 1 is a trench gate type power "Vertical Double-diffused Metal Oxide Semiconductor Field Effect Transistor" (hereinafter "VDMOSFET;"

discrete device) employing SiC, and is provided, for example, in a chip form having a square plan shape. The chip-form field effect transistor 1 has vertical and lateral dimensions of several millimeters as seen on a paper surface of FIG. 1A.

The field effect transistor 1 includes a SiC substrate 2, and a multiplicity of unit cells 4 defined by a gate trench 3 having a lattice shape as seen in plan. That is, the unit cells 4, which each have a rectangular cube shape, are arranged in a matrix array on the SiC substrate 2 so as to be respectively located in windows of the lattice-shaped gate trench 3. The unit cells 4 each have vertical and lateral dimensions of not greater than 10 μm as seen on a paper surface of FIG. 1B, and each include a square source trench 5 provided at a center thereof as extending downward from a front surface thereof toward the SiC substrate 2, as seen in plan.

A source pad 6 is provided on a front surface of the field effect transistor 1. The source pad 6 has a generally square shape having four corners rounded outward as seen in plan, and covers the generally entire front surface of the field effect transistor 1. The source pad 6 has a generally square absent region 7 provided adjacent a middle portion of one edge thereof as seen in plan. The absent region 7 is a region in which the source pad 6 is not present.

A gate pad 8 is disposed in the absent region 7. The gate pad 8 and the source pad 6 are spaced from each other, and isolated from each other.

Figure 2:
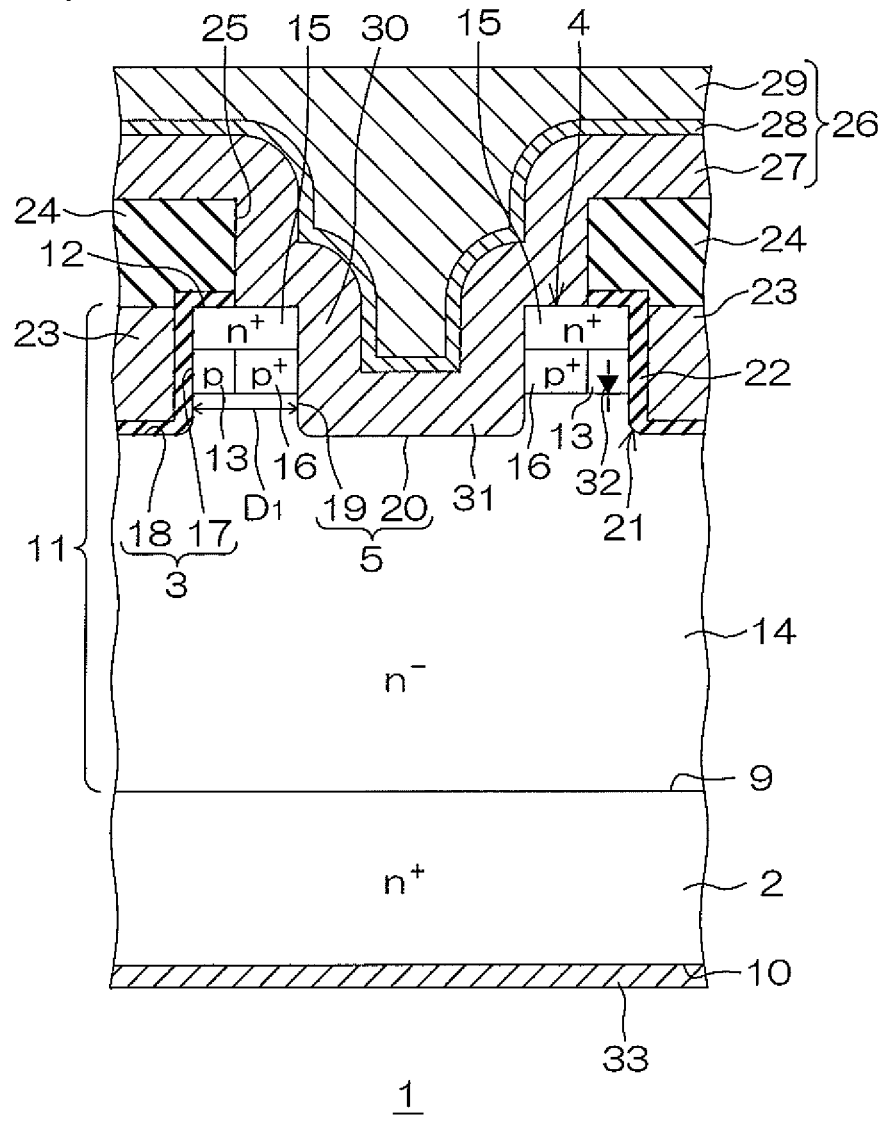
FIG. 2 is a schematic sectional view of the field effect transistor taken along a section line II-II in FIG. 1B according to the first embodiment of the present invention.

FIG. 2 is a schematic sectional view of the field effect transistor taken along a section line II-II in FIG. 1B according to the first embodiment of the present invention.

Referring to FIG. 2, the sectional structure of the field effect transistor 1 will be described. The field effect transistor 1 includes a SiC substrate 2 of an n$^+$-type (for example, having a concentration of $1\times10^{18}$ to $1\times10^{21}$ cm$^{-3}$). In this embodiment, the SiC substrate 2 serves as a drain of the transistor 1, and has a front surface 9 (upper surface) defined by a Si plane and a back surface 10 (lower surface) defined by a C plane.

A SiC epitaxial layer 11 of an n$^-$-type having a lower concentration than the SiC substrate 2 (for example, having a concentration of $1\times10^{15}$ to $1\times10^{17}$ cm$^{-3}$) is provided on the SiC substrate 2. The epitaxial layer 11 is formed as a SiC semiconductor layer on the SiC substrate 2 by so-called epitaxial growth. The epitaxial layer 11 to be formed on the front surface 9 (Si plane) is grown with the Si plane defined as a major growth plane. Therefore, a front surface 12 of the epitaxial layer 11 formed by the growth is a Si plane like the front surface 9 of the SiC substrate 2.

The epitaxial layer 11 includes p-type body regions 13 extensively provided in a well form in a portion thereof adjacent to the front surface 12 (on a Si plane side) as each having a concentration of $1\times10^{16}$ to $1\times10^{19}$ cm$^{-3}$. A portion of the epitaxial layer 11 extending from the body regions 13 to the SiC substrate 2 (on a C plane side) serves as an n$^-$-type drift region 14 which is maintained as it is after the epitaxial growth.

The body regions 13 each include an n$^+$-type source region 15 (for example, having a concentration of $1\times10^{18}$ to $1\times10^{21}$ cm$^{-3}$) and a p$^+$-type body contact region 16 (for example, having a concentration of $1\times10^{18}$ to $1\times10^{21}$ cm$^{-3}$) provided on a side of the source region 15 closer to the SiC substrate 2 (below the source region 15). A multiplicity of body contact regions 16 are arranged in a matrix array when the SiC substrate 2 is seen in plan.

Source trenches 5 are provided in the same number as the body contact regions 16 as extending through the respective body contact regions 16. A lattice-shaped gate trench 3 is provided as surrounding the respective body contact regions 16 formed with the source trenches 5. Thus, a multiplicity of unit cells 4 each functioning as a field effect transistor are provided in the epitaxial layer 11. In each of the unit cells 4, the body contact region 16 surrounds the source trench 5, and the body region 13 surrounds the body contact region 16. Further, a portion of the body region 13 opposite from the body contact region 16 is exposed in a side surface 17 of the gate trench 3. A gate length is measured along the depth of the gate trench 3, while a gate width is measured along a peripheral edge of the unit cell 4 perpendicularly to the gate length.

The source trenches 5 and the gate trench 3 each extend from the front surface 12 of the epitaxial layer 11 to the drift region 14 through the body region 13. In this embodiment, the source trenches 5 and the gate trench 3 have the same depth. The drift region 14 is exposed in bottoms of the source trenches 5 and the gate trench 3. Side surfaces 19 of the source trenches 5 are each spaced a distance $D_1$ of, for example, 0.5 μm to 3 μm from the corresponding side surface 17 of the gate trench 3. Where the distance $D_1$ is within this range, it is possible to suppress the increase in resistance (ON resistance) when the unit cells 4 are turned on, and to alleviate the electric field applied to the bottom of the gate trench 3.

Opposite edge corner portions 21 of the bottom of the gate trench 3 opposed to each other perpendicularly to the gate width (in a direction in which each two adjacent unit cells 4 are opposed) are rounded toward the drift region 14. The gate trench 3 has a U-sectional shape which is defined by the opposed side surfaces 17 and a bottom surface 18 connected by rounded surfaces. Like the gate trench 3, the source trenches 5 each have a U-sectional shape which is defined by opposed side surfaces 19 and a bottom surface 20 connected by rounded surfaces. Thus, the electric field applied to the opposite edge corner portions 21 of the bottom of the gate trench 3 can be distributed outside the opposite edge corner portions 21, thereby substantially preventing dielectric breakdown of a portion of a gate insulation film 22 present on the bottom surface 18.

The gate insulation film 22 covers the entire interior surface of the gate trench 3. The gate insulation film 22 is a nitrogen-containing oxide film such as a silicon nitride oxide film formed, for example, by thermal oxidation employing a gas containing nitrogen and oxygen. The gate insulation film 22 has a nitrogen content (nitrogen concentration) of, for example, 0.1 to 10%.

An inside space of the gate insulation film 22 is filled with a polysilicon material doped with an n-type impurity in a high concentration, whereby a gate electrode 23 is provided in the gate trench 3. Thus, vertical MIS transistor structures are each provided, in which the source region 15 and the drift region 14 are spaced from each other vertically and perpendicularly to the front surface 12 (major surface) of the epitaxial layer 11 by the body region 13.

An interlevel insulation film 24 of $SiO_2$ is provided on the epitaxial layer 11. Contact holes 25 each having a greater diameter than the source trenches 5 are provided in the interlevel insulation film 24 and the gate insulation film 22. Thus, the entire source trenches 5 of the respective unit cells 4 (i.e., the side surfaces 19 and the bottom surfaces 20 of the source trenches 5) and portions of the front surface 12 of the epitaxial layer 11 around the source trenches 5 are exposed in the contact holes 25, so that steps are provided according to level differences between the front surface 12 and the bottom surfaces 20.

A source electrode 26 is provided over the interlevel insulation film 24. The source electrode 26 fills the source trenches 5 of the respective unit cells 4 via the respective contact holes 25 to contact the drift region 14, the body contact regions 16 and the source regions 15 in this order from the bottoms of the source trenches 5. That is, the source electrode 26 is a common interconnection to be shared by all the unit cells 4. Another interlevel insulation film (not shown) is provided on the source electrode 26. The source electrode 26 is electrically connected to the source pad 6 (see FIG. 1A) via the interlevel insulation film (not shown). On the other hand, a gate pad 8 (see FIG. 1A) is electrically connected to the gate electrode 23 through a gate interconnection (not shown) routed on the interlayer insulation film (not shown).

The source electrode 26 includes a polysilicon layer 27, an intermediate layer 28 and a metal layer 29 provided in this order from a portion thereof contacting the epitaxial layer 11.

The polysilicon layer 27 is a doped layer which is formed by using polysilicon doped with an impurity. For example, the polysilicon layer 27 is a higher concentration doped layer which is doped with the impurity, for example, in a high concentration on the order of not less than $1 \times 10^{15}$ cm$^{-3}$, preferably $1 \times 10^{19}$ to $1 \times 10^{21}$ cm$^{-3}$. Examples of the impurity to be used for the formation of the polysilicon layer 27 as the doped layer (including the higher concentration doped layer) include n-type impurities such as N (nitrogen), P (phosphorus) and As (arsenic), and p-type impurities such as Al (aluminum) and B (boron). The polysilicon layer 27 has a thickness of, for example, 5000 Å to 10000 Å.

In this embodiment, the polysilicon layer 27 covers the entire surfaces of the unit cells 4 exposed in the contact holes 25, and contacts the drift region 14, the body contact regions 16 and the source regions 15 in the source trenches 5.

That is, the polysilicon layer 27 includes first portions 30 which each contact the body contact region 16 (higher concentration impurity region) on the side surface 19 of the source trench 5 and each contact the source region 15 on the portion of the front surface 12 of the epitaxial layer 11 around the source trench 5, and second portions 31 which each serve as a barrier forming layer contacting the lower concentration drift region 14 on the side surface 19 and the bottom surface 20. The first portions 30 of the polysilicon layer 27 each form ohmic junctions with respect to the higher concentration body contact region 16 and the source region 15. On the other hand, the second portions 31 each form a hetero junction with respect to the lower concentration drift region 14 to form a junction barrier (e.g., a junction barrier potential of 1 eV to 1.5 eV) lower than the diffusion potential (e.g., 2.8 eV to 3.2 eV) of a body diode 32 (a pn diode defined by a junction between the body region 13 and the drift region 14) present in the field effect transistor 1.

The intermediate layer 28 is a metal layer provided on the polysilicon layer 27, and has a single layer structure including a Ti (titanium)-containing layer or has a layered structure including a plurality of layers including a Ti-containing layer. The Ti-containing layer may be made of Ti, TiN (titanium nitride) or the like. The intermediate layer 28 has a thickness of, for example, 200 nm to 500 nm.

The metal layer 29 is provided on the intermediate layer 28, and exemplary materials for the metal layer 29 include Al (aluminum), Au (gold), Ag (silver), Cu (copper) and Mo (molybdenum), alloys of any of these metals, and metal materials containing any of these metals. The metal layer 29 defines the outermost layer of the source electrode 26. The metal layer 29 has a thickness of, for example, 1 μm to 5 μm.

In this embodiment, the combination of the polysilicon layer 27, the intermediate layer 28 and the metal layer 29 provides a layered structure (Poly-Si/Ti/TiN/Al) including a Poly-Si layer (polysilicon layer 27), a Ti layer (intermediate layer 28), a TiN layer (intermediate layer 28) and an Al layer (metal layer 29) which are stacked in this order. In addition, the metal layer 29 preferably includes a Mo sublayer. Since Mo has a higher melting point, the provision of the Mo sublayer in the metal layer 29 substantially prevents the metal layer 29 from being melted to be damaged by heat generated when high current flows through the source electrode 26.

A drain electrode 33 covers the entire back surface 10 of the SiC substrate 2. The drain electrode 33 is a common electrode shared by all the unit cells 4. For example, the drain electrode 33 has a layered structure (Ni silicide/Al) including a Ni silicide layer and an Al layer stacked in this order from the SiC substrate 2.

FIGS. 3A to 3M are schematic sectional views for explaining a method of producing the field effect transistor shown in FIG. 2.

As shown in FIG. 3A, SiC crystal is first grown on a front surface 9 (Si plane) of a SiC substrate 2 by an epitaxial growth method such as a CVD (Chemical Vapor Deposition) method, an LPE (Liquid Phase Epitaxy) method or an MBE (Molecular Beam Epitaxy) method, while being doped with an impurity. Thus, an n$^-$-type epitaxial layer 11 is formed on the SiC substrate 2.

In turn, as shown in FIG. 3B, a p-type impurity is implanted into the epitaxial layer 11 from a front surface 12 of the epitaxial layer 11. At this time, conditions for the implantation depend on the type of the p-type impurity, but the acceleration energy, for example, is 200 keV to 3000 keV.

Figure 3C:
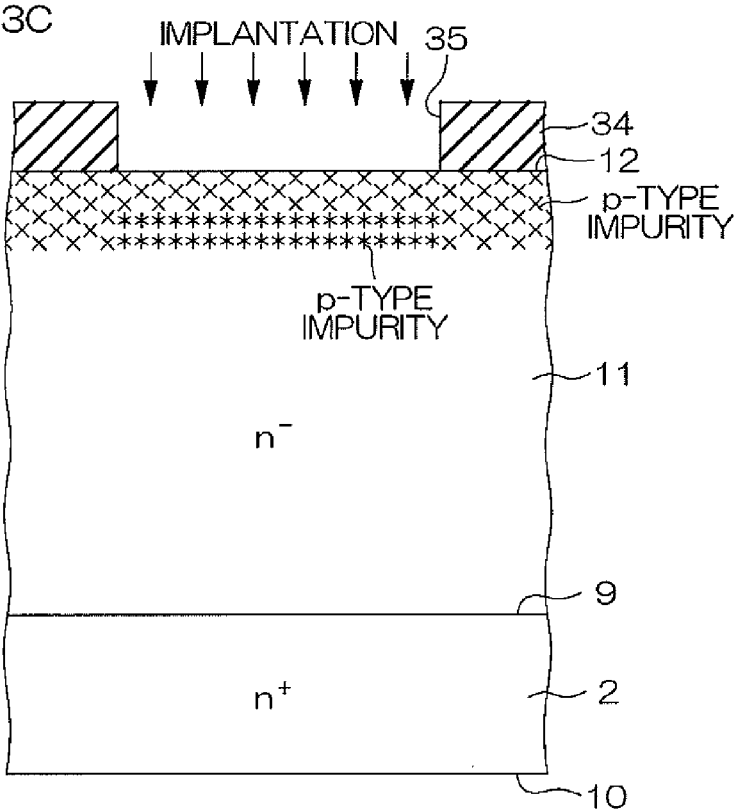
FIG. 3C is a diagram showing a step subsequent to the step of FIG. 3B.

Then, as shown in FIG. 3C, a mask 34 of SiO$_2$ is formed on the epitaxial layer 11 by a CVD method. In turn, the mask 34 is etched via a photoresist (not shown) to be patterned into a pattern having openings 35 on regions of the epitaxial layer 11 to be formed with body contact regions 16. After the formation of the openings 35, a p-type impurity is implanted into the epitaxial layer 11 from the front surface 12 of the epitaxial layer 11. At this time, conditions for the implantation depend on the type of the p-type impurity, but the acceleration energy, for example, is 30 keV to 400 keV. After the implantation of the p-type impurity, the mask 34 is removed.

Figure 3D:
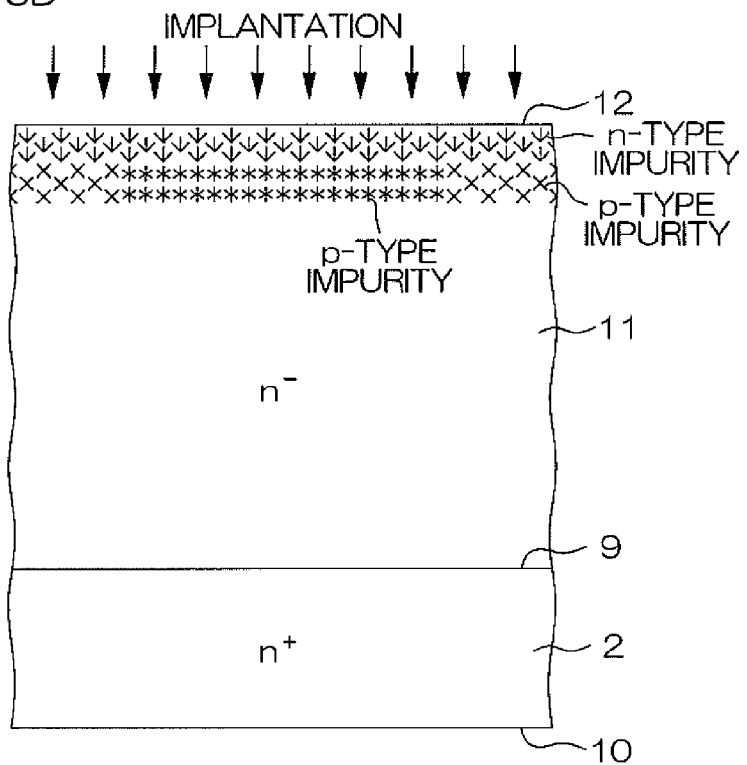
FIG. 3D is a diagram showing a step subsequent to the step of FIG. 3C.

Subsequently, as shown in FIG. 3D, an n-type impurity is implanted into the epitaxial layer 11 from the front surface 12 of the epitaxial layer 11. At this time, conditions for the implantation depend on the type of the n-type impurity, but the acceleration energy, for example, is 30 keV to 400 keV.

Figure 3E:
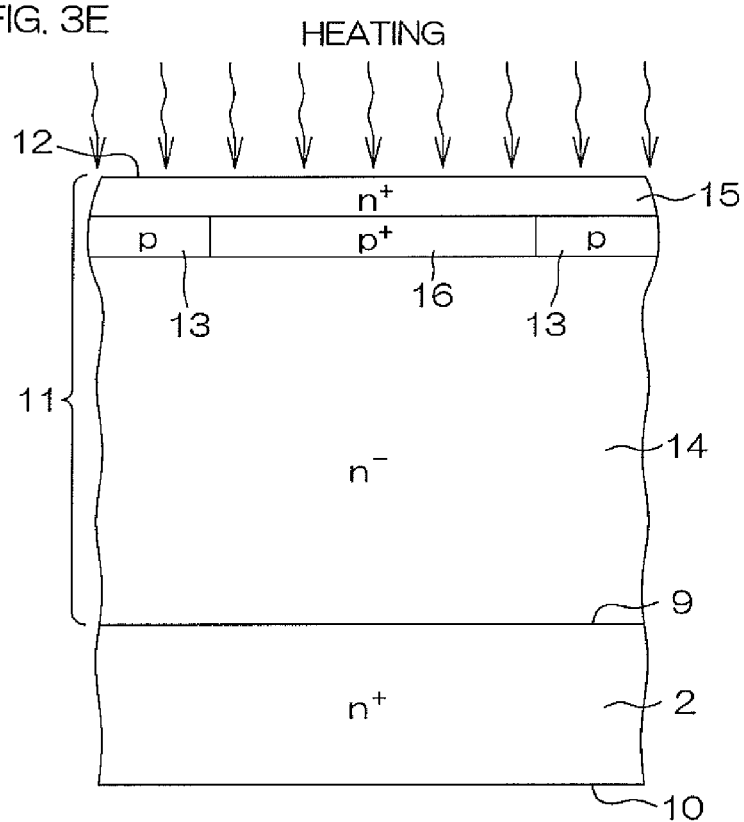
FIG. 3E is a diagram showing a step subsequent to the step of FIG. 3D.

In turn, as shown in FIG. 3E, the epitaxial layer 11 is heat-treated, for example, at 1400° C. to 2000° C. Thus, ions of the n-type and p-type impurities implanted in a surface portion of the epitaxial layer 11 are activated, whereby body regions 13, source regions 15 and the body contact regions 16 are formed in corresponding implantation regions. A base portion of the epitaxial layer 11 serves as a drift region 14 which is maintained as it is after the epitaxial growth. The heat treatment of the epitaxial layer 11 may be performed by properly controlling the temperature of a resistance heating furnace or a radio frequency induction heating furnace.

Figure 3F:
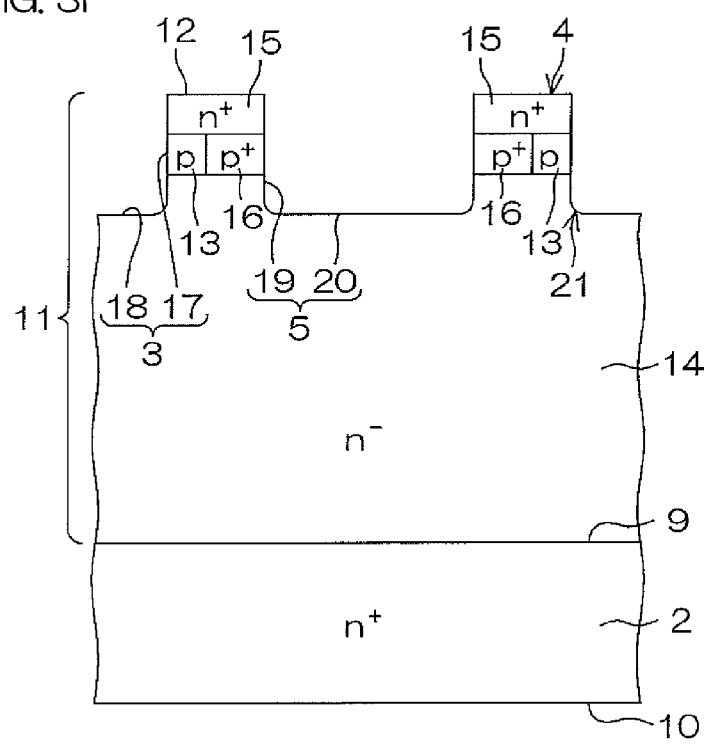
FIG. 3F is a diagram showing a step subsequent to the step of FIG. 3E.

Subsequently, as shown in FIG. 3F, the epitaxial layer 11 is etched by using a mask having openings on regions of the epitaxial layer 11 to be formed with a gate trench 3 and source trenches 5. Thus, the epitaxial layer 11 is dry-etched from the front surface 12 (Si plane) thereof, whereby the gate trench 3 and the source trenches 5 are simultaneously formed. Thus, a multiplicity of unit cells 4 are formed in the epitaxial layer 11. Exemplary etching gases to be herein used include a gas mixture (SF$_6$/O$_2$ gas) containing SF$_6$ (hexafluorosulfur) and O$_2$ (oxygen), and a gas mixture (SF$_6$/O$_2$/HBr gas) containing SF$_6$, O$_2$ and HBr (hydrogen bromide).

Then, as shown in FIG. 3G, the front surface 12 of the epitaxial layer 11 is oxidized, whereby a silicon nitride oxide film (gate insulation film 22) is formed over the entire front surface 12.

Figure 3H:
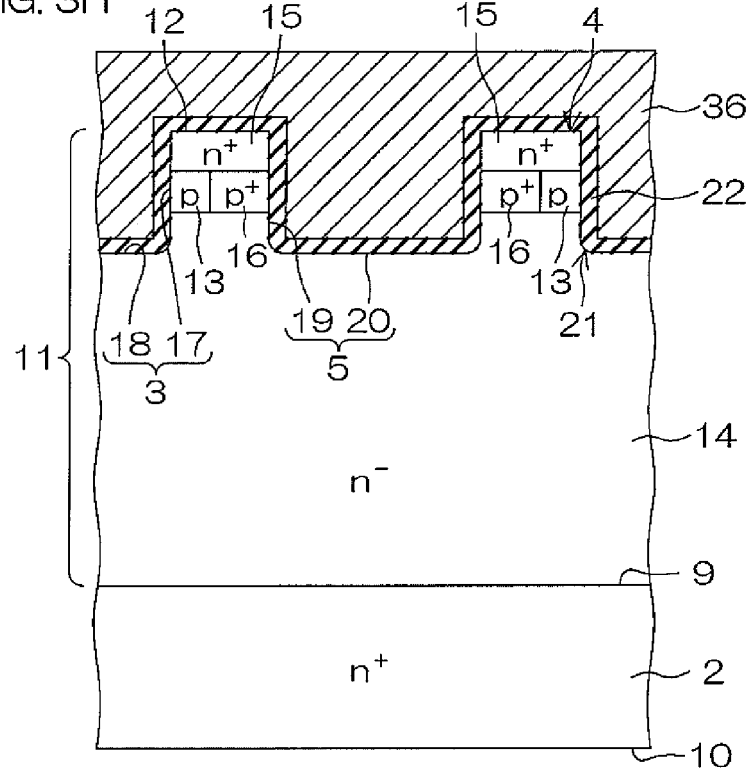
FIG. 3H is a diagram showing a step subsequent to the step of FIG. 3G.

In turn, as shown in FIG. 3H, a doped polysilicon material 36 is deposited from above the epitaxial layer 11 by a CVD method. The deposition of the polysilicon material 36 is continued until at least the gate trench 3 and the source trenches 5 are completely filled with the polysilicon material 36.

Figure 3I:
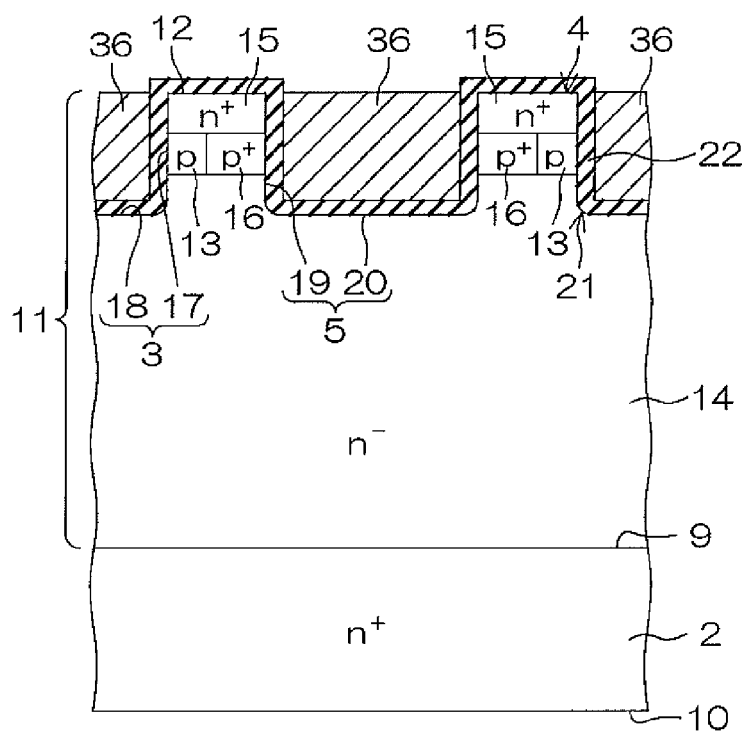
FIG. 3I is a diagram showing a step subsequent to the step of FIG. 3H.

Thereafter, as shown in FIG. 3I, the deposited polysilicon material 36 is etched back until an etched-back surface becomes flush with the front surface 12 of the epitaxial layer 11.

Figure 3J:
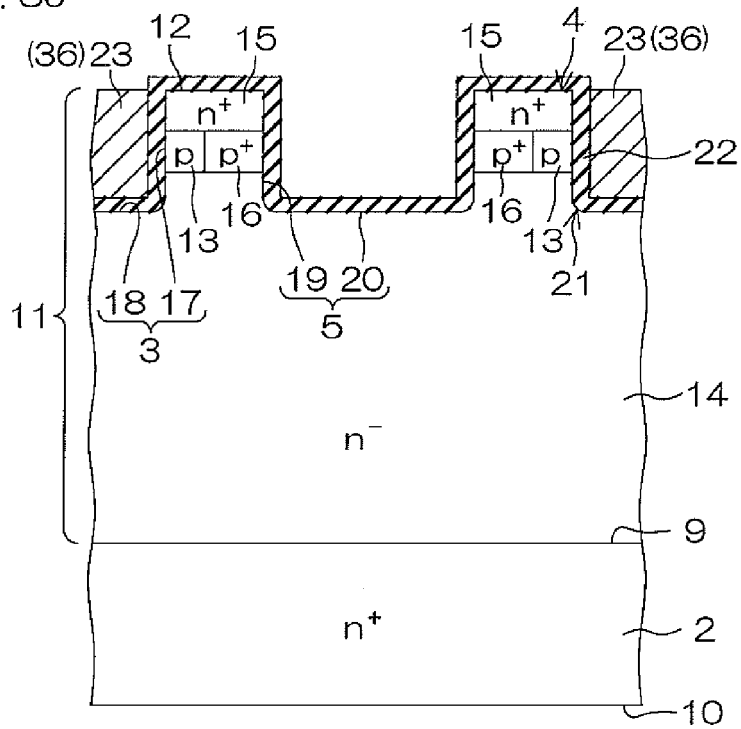
FIG. 3J is a diagram showing a step subsequent to the step of FIG. 3I.

Subsequently, as shown in FIG. 3J, parts of the polysilicon material 36 remaining in the source trenches 5 are removed by dry-etching. Thus, a gate electrode 23 is formed, which is defined by a part of the polysilicon material 36 remaining in the gate trench 3.

Figure 3K:
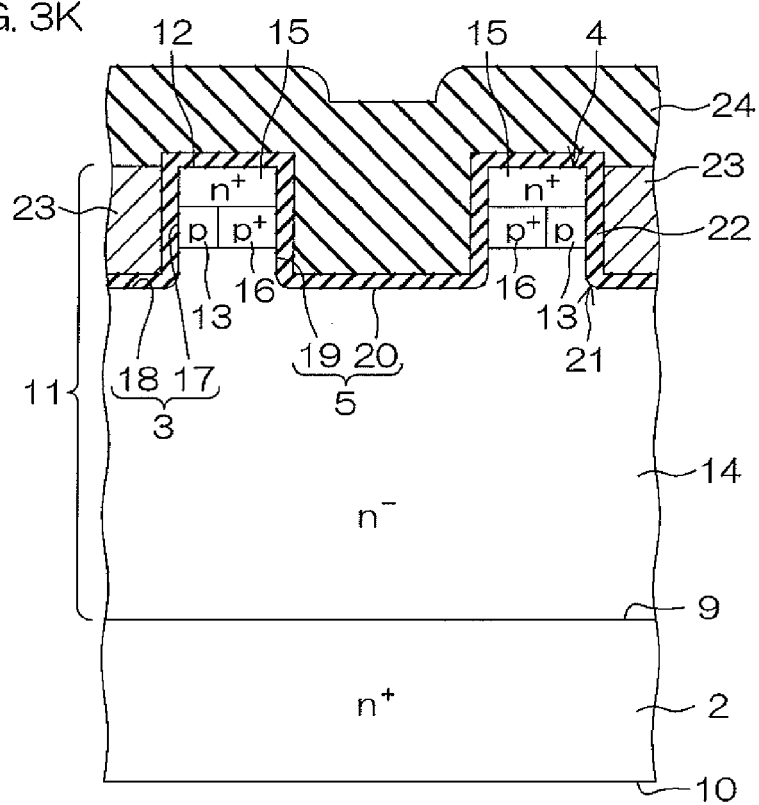
FIG. 3K is a diagram showing a step subsequent to the step of FIG. 3J.

In turn, as shown in FIG. 3K, an interlevel insulation film 24 of $SiO_2$ is formed on the epitaxial layer 11 by a CVD method.

Then, as shown in FIG. 3L, the interlevel insulation film 24 and the gate insulation film 22 are sequentially patterned, whereby contact holes 25 are formed in the interlevel insulation film 24 and the gate insulation film 22.

In turn, as shown in FIG. 3M, a polysilicon material is deposited until the contact holes 25 are filled with the polysilicon material. Thereafter, an n-type or p-type impurity is implanted into the deposited polysilicon material. At this time, conditions for the implantation depend on the type of the impurity, but the acceleration energy, for example, is 10 keV to 100 keV. Thereafter, a Ni layer is formed on a back surface 10 of the SiC substrate 2. In turn, an RTA (Rapid Thermal Annealing) process is performed at 1000° C. for 2 minutes. Thus, the impurity in the polysilicon material is diffused, whereby a polysilicon layer 27 is formed and the Ni layer formed on the back surface 10 is silicided. Then, Ti and TiN are deposited in this order on a surface of the polysilicon layer 27 by a sputtering method, an evaporation method or the like, whereby an intermediate layer 28 is formed. In turn, a metal such as Al is deposited on a surface of the intermediate layer 28 by a sputtering method, an evaporation method or the like, whereby a metal layer 29 is formed. Thus, a source electrode 26 is formed. Subsequently, Al is deposited on the back surface 10 of the SiC substrate 2, whereby a drain electrode 33 is formed.

Thereafter, an interlevel insulation film (not shown), a source pad 6, a gate pad 8 and the like are formed, whereby the field effect transistor 1 shown in FIG. 2 is provided.

The SiC field effect transistor 1 is used as a switching device for a driving circuit (invertor circuit) of an electric motor (an exemplary inductive load). In this case, electric current flowing through the electric motor is switched on and off by turning on and off application of a predetermined voltage (not lower than a gate threshold voltage) to the gate pad 8 while applying a drain voltage between the source pad 6 (source electrode 26) and the drain electrode 33 (between the source and the drain) with the drain kept at a positive potential.

When the electric current flowing through the electric motor is cut off (i.e., the gate voltage is turned off), a counter-electromotive voltage is generated in a motor coil of the electric motor. The counter-electromotive voltage is liable to be applied between the source and the drain with the source kept at a positive potential.

In this case, if the current flows into the motor coil as return current due to the rectification of the body diode 32, the following problem occurs.

When holes migrate from the p-type body region 13 to the n-type drift region 14 of the body diode 32 to cause the current to flow, electrons as major carriers are liable to be recombined with the holes migrating from the p-type body region 13 around the gate trench 3 (e.g., on a lateral side of the gate trench 3) in the n-type drift region 14. Therefore, SiC crystal defects in the epitaxial layer 11 are liable to be extended parallel to the deposition direction of the epitaxial layer 11 due to energy generated by the recombination to reach a drain current path (e.g., the channel) during an ON period. Thus, when the field effect transistor 1 performs the switching operation with the channel being formed in a portion of the body region 13 adjacent to the side surface 17 of the gate trench 3, the ON resistance is liable to increase.

In this case, the current preferentially flows through the hetero junction between the second portion 31 of the polysilicon layer 27 and the drift region 14 to reduce or eliminate the current flowing through the body diode 32. Thus, the current flowing through the field effect transistor 1 can flow into the electric motor, for example, as return current.

During an OFF period, the current flows into the drift region 14 from the second portion 31 of the polysilicon layer 27 provided in the source trench 5 at the center of the unit cell 4 surrounded by the gate trench 3, so that carriers hardly migrate around the gate trench 3 (i.e., between the p-type body region 13 and the n-type drift region 14). This prevents the recombination of the holes and the electrons in the drift region 14. As a result, the extension of the SiC crystal defects in the epitaxial layer 11 can be suppressed, thereby suppressing the increase in the ON resistance of the transistor 1.

Since the source trench 5 simultaneously exposes both the source region 15 and the drift region 14, the polysilicon layer 27 (source electrode 26) formed in the source trench 5 can be brought into contact with both the source region 15 and the drift region 14. Thus, the polysilicon layer 27 of the source electrode 26 forms an ohmic junction with respect to the source region 15, and forms a hetero junction with respect to the drift region 14 to form a junction barrier lower than the diffusion potential of the body diode 32. Therefore, these junctions can be formed in the step of forming the polysilicon layer 27 (see FIG. 3M) in the production process for the field effect transistor 1.

In addition, the layer provided in contact with the source region 15 and the drift region 14 is made of polysilicon. This makes it possible to form the ohmic junction between the first portion 30 and the higher concentration source region 15, and to form the hetero junction between the second portion 31 and the lower concentration drift region 14 without precisely controlling the annealing temperature in the production process. Without the need for precisely controlling the annealing temperature, the aforementioned two junctions can be simultaneously formed by the deposition of the polysilicon layer 27 and the annealing (see FIG. 3M).

Further, polysilicon ensures excellent step coverage. Therefore, even if a step is formed according to a level difference between the front surface 12 of the epitaxial layer 11 and the bottom surface 20 of the source trench 5 in the contact hole 25, the polysilicon layer 27 can be properly provided in intimate contact with surfaces exposed in the contact hole 25. That is, the polysilicon layer 27 can be provided in intimate contact with portions of the source region 15 exposed in the side surfaces 19 and the front surface 12 around the source trench 5 and portions of the drift region 14 exposed in the side surfaces 19 and the bottom surface 20. As a result, the connection reliability of the source electrode 26 is improved.

Since the impurity concentration of the body contact region 16 provided in contact with the polysilicon layer 27 is $1\times10^{18}$ to $1\times10^{21}$ cm$^{-3}$, the contact resistance between the body region 13 and the polysilicon layer 27 (first portion 30) can be reduced. This suppresses a voltage drop at the junction between the polysilicon layer 27 and the body region 13. Further, the sheet resistance of the body region 13 can be reduced, thereby preventing the operation of a parasitic bipolar transistor (a bipolar transistor defined by the source region 15, the body region 13 and the drift region 14). Further, the impurity concentration of the source region 15 provided in contact with the polysilicon layer 27 is $1\times10^{18}$ to $1\times10^{21}$ cm$^{-3}$, so that the contact resistance between the source region 15 and the polysilicon layer 27 (first portion 30) and the sheet resistance of the source region 15 can be reduced to thereby reduce the ON resistance of the transistor. As a result, a transistor operation can be properly performed.

Since the polysilicon layer 27 has a high impurity concentration on the order of $1\times10^{19}$ to $1\times10^{21}$ cm$^{-3}$, the junction barrier between the polysilicon layer 27 and the body region 13 (body contact region 16) can be sufficiently increased. As a result, a leak current between the polysilicon layer 27 and the drift region 14 can be suppressed.

The combination of the polysilicon layer 27, the intermediate layer 28 and the metal layer 29 of the source electrode 26 provides the layered structure (Poly-Si/Ti/TiN/Al) including the Poly-Si layer (polysilicon layer 27), the Ti layer (intermediate layer 28), the TiN layer (intermediate layer 28) and the Al layer (metal layer 29) which are stacked in this order. Since the Ti-containing intermediate layer 28 has excellent adhesion to both the polysilicon and the metal material, the aforementioned layered structure improves the adhesion between the polysilicon layer 27 and the metal layer 29. As a result, the connection reliability of the source electrode 26 can be improved.

Further, the TiN layer is disposed between the polysilicon layer 27 and the metal layer 29 (Al layer), so that the TiN layer serves as a barrier layer which prevents the diffusion of Al from the metal layer 29 to the polysilicon layer 27. Thus, an excess amount of Al is prevented from diffusing into the polysilicon layer 27, thereby stabilizing the impurity concentration of the polysilicon layer 27. As a result, the resistance value of the polysilicon layer 27 can be stabilized.

In the field effect transistor 1, the source trench 5 is provided at the center of each of the unit cells 4 surrounded by the gate trench 3. This substantially prevents opposite edge corner portions of the gate trench 3 from having dense equipotential line distribution. As a result, the electric field applied to the opposite corner portions of the bottom of the gate trench 3 can be alleviated, thereby suppressing the dielectric breakdown of the portion of the gate insulation film 22 present on the bottom surface 18.

Figure 4:
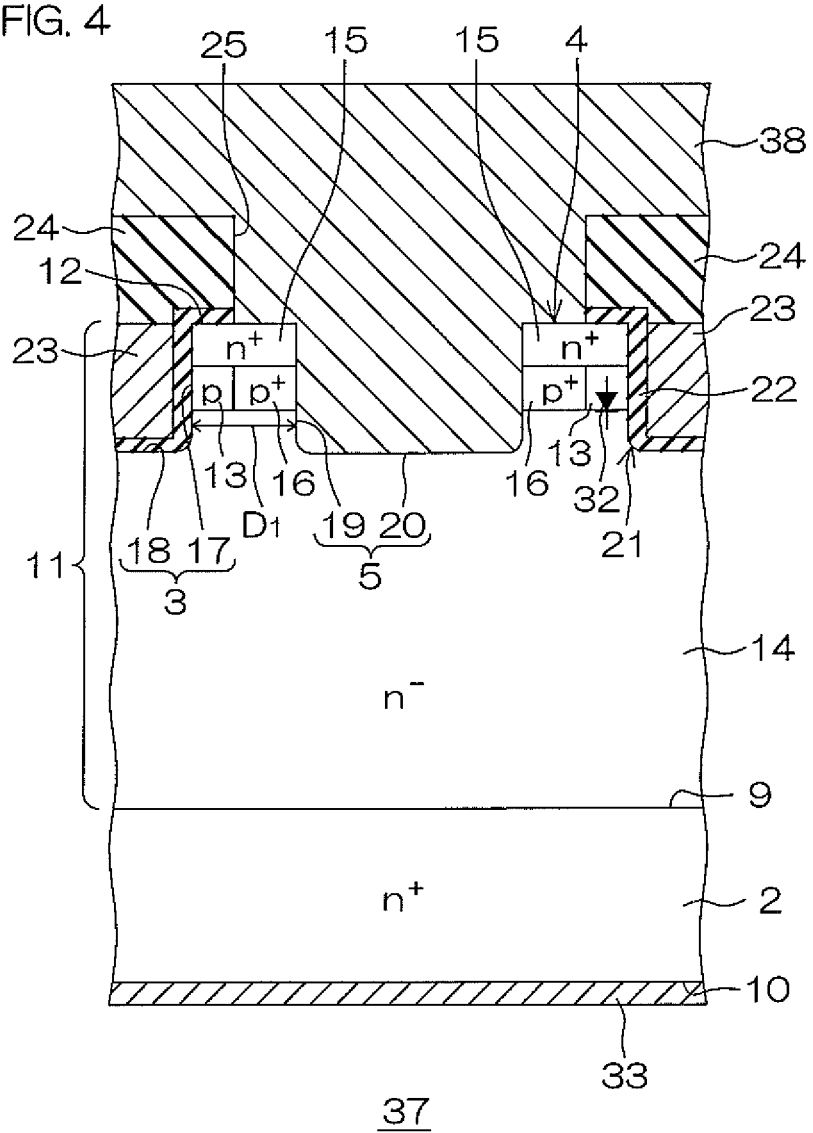
FIG. 4 is a schematic sectional view for explaining a first modification of the field effect transistor shown in FIG. 2.
Figure 7A:
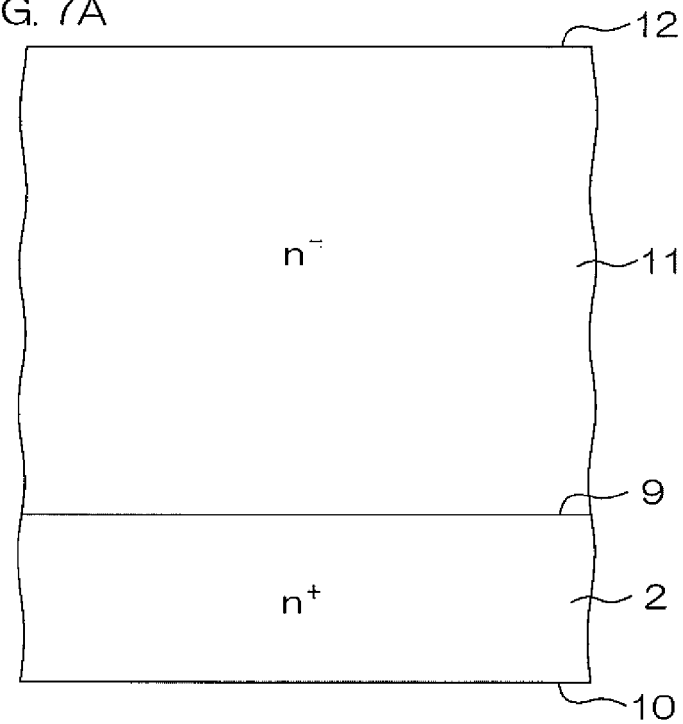
FIG. 7A is a schematic sectional view for explaining a method of producing the field effect transistor shown in FIG. 6.
Figure 7B:
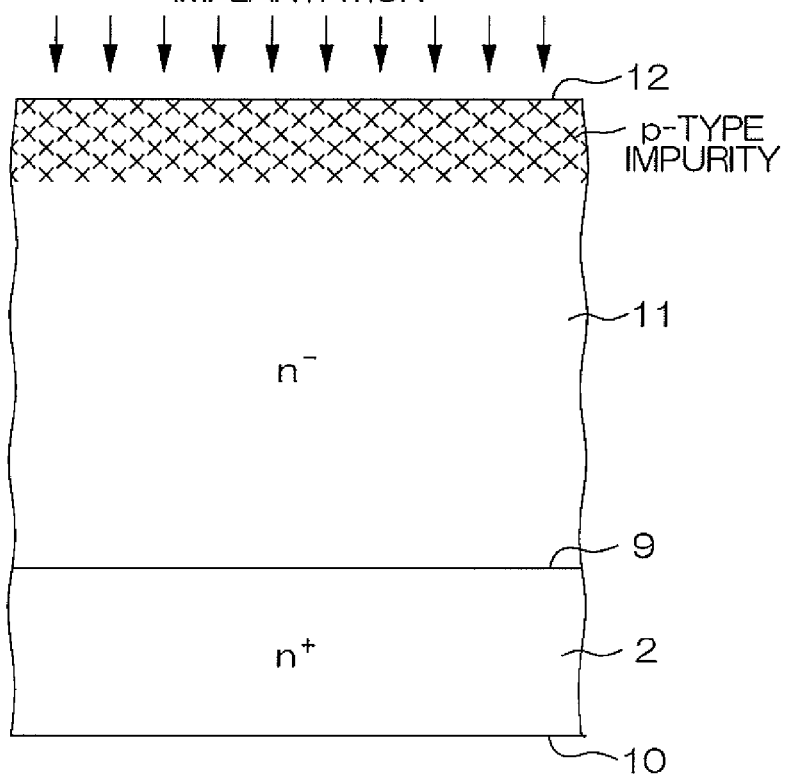
FIG. 7B is a diagram showing a step subsequent to the step of FIG. 7A.
Figure 7C:
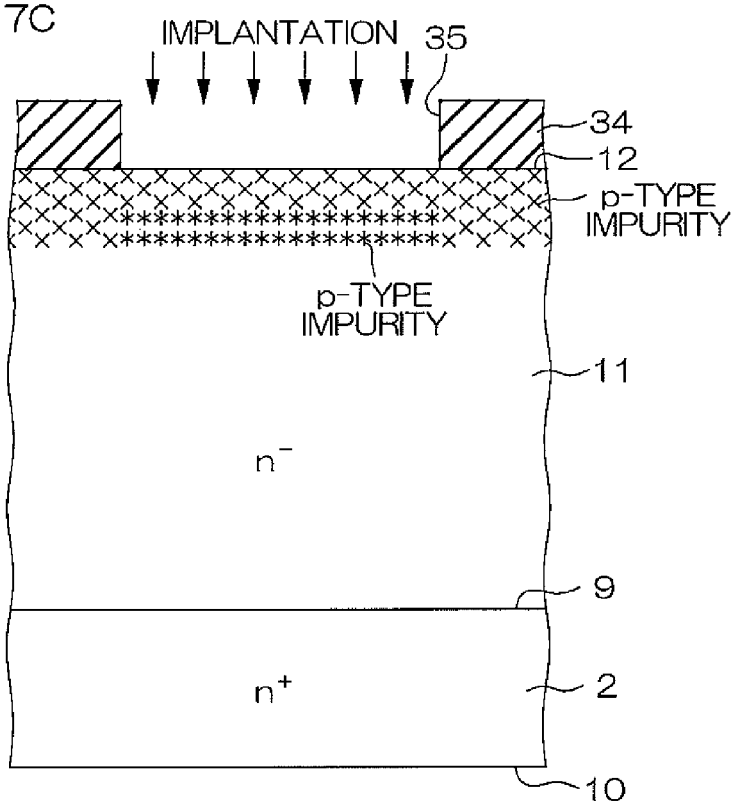
FIG. 7C is a diagram showing a step subsequent to the step of FIG. 7B.
Figure 7D:
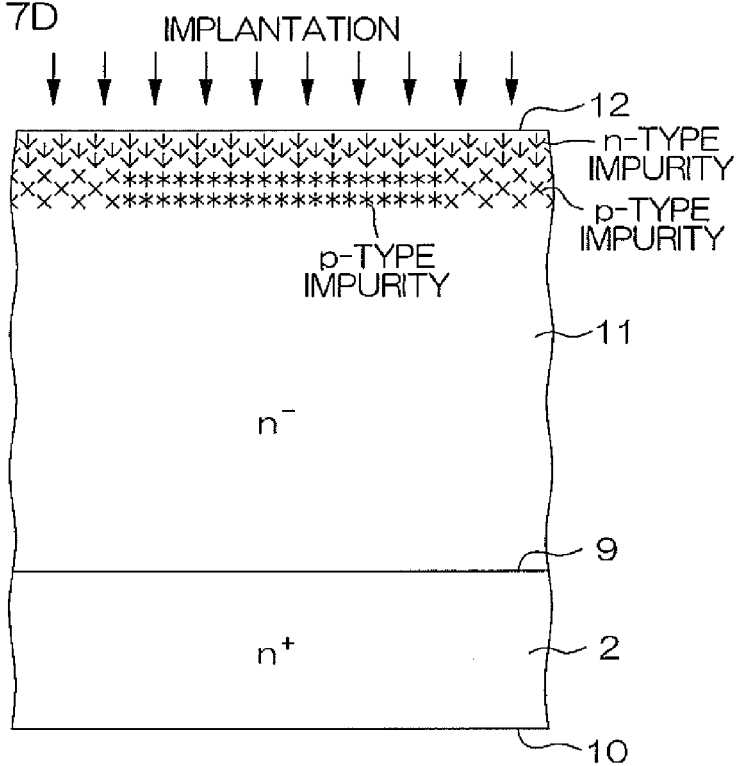
FIG. 7D is a diagram showing a step subsequent to the step of FIG. 7C.
Figure 7E:
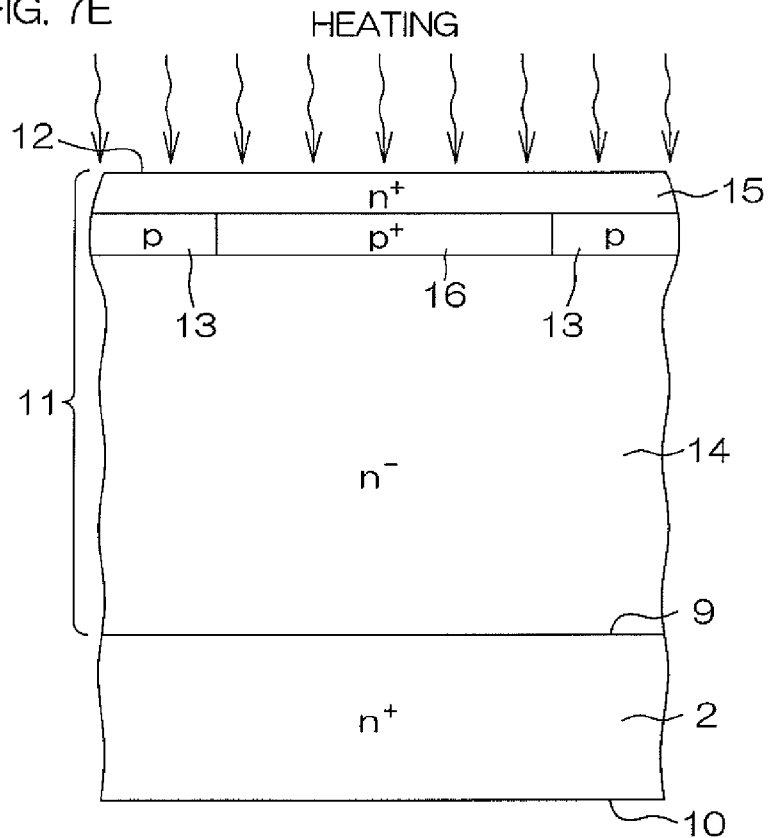
FIG. 7E is a diagram showing a step subsequent to the step of FIG. 7D.
Figure 7F:
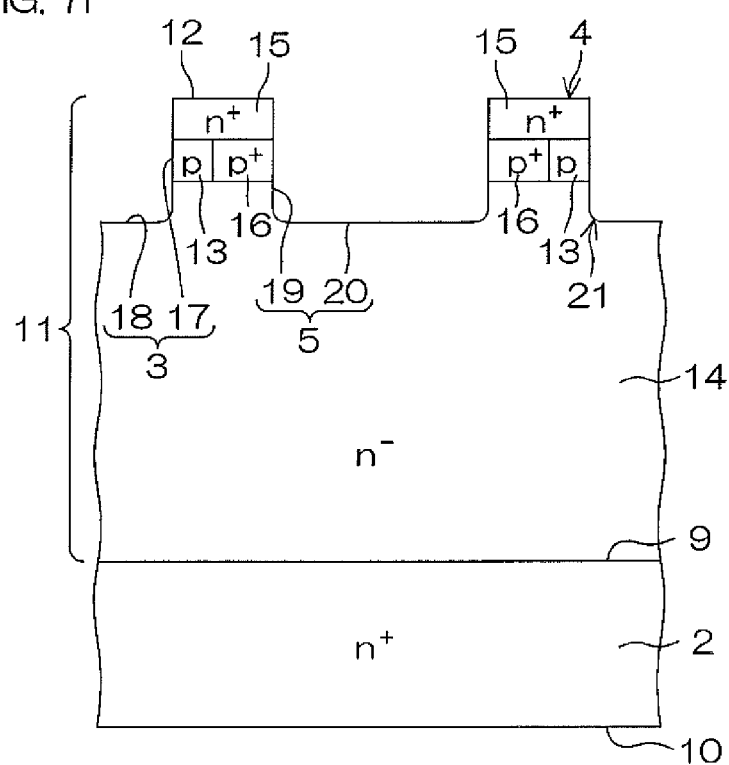
FIG. 7F is a diagram showing a step subsequent to the step of FIG. 7E.
Figure 7G:
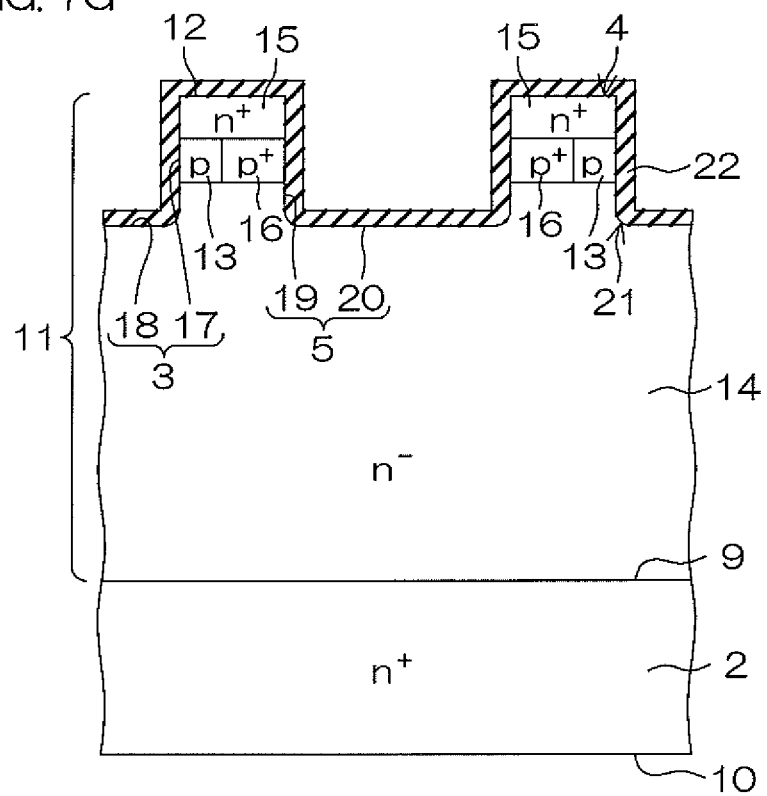
FIG. 7G is a diagram showing a step subsequent to the step of FIG. 7F.
Figure 7H:
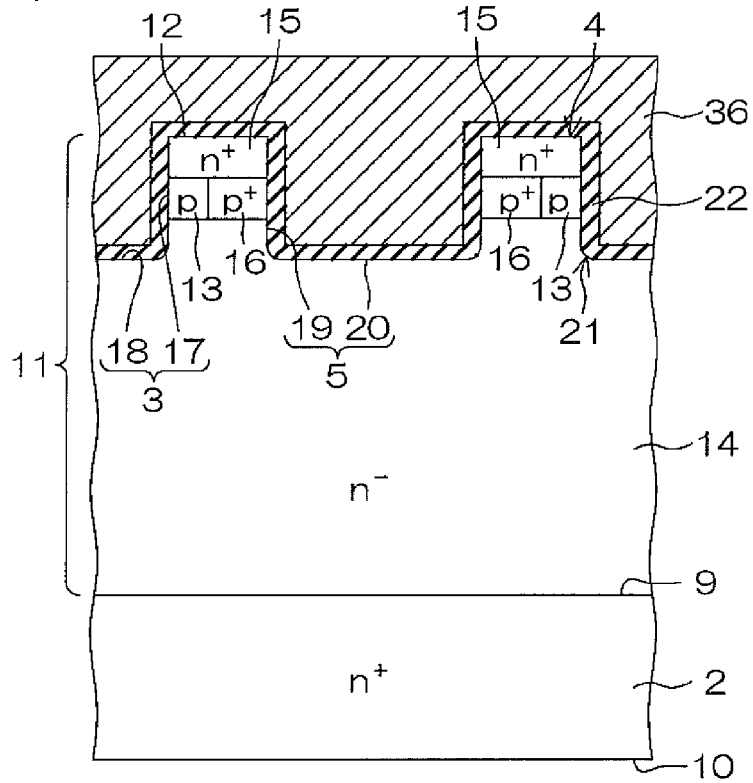
FIG. 7H is a diagram showing a step subsequent to the step of FIG. 7G.
Figure 7I:
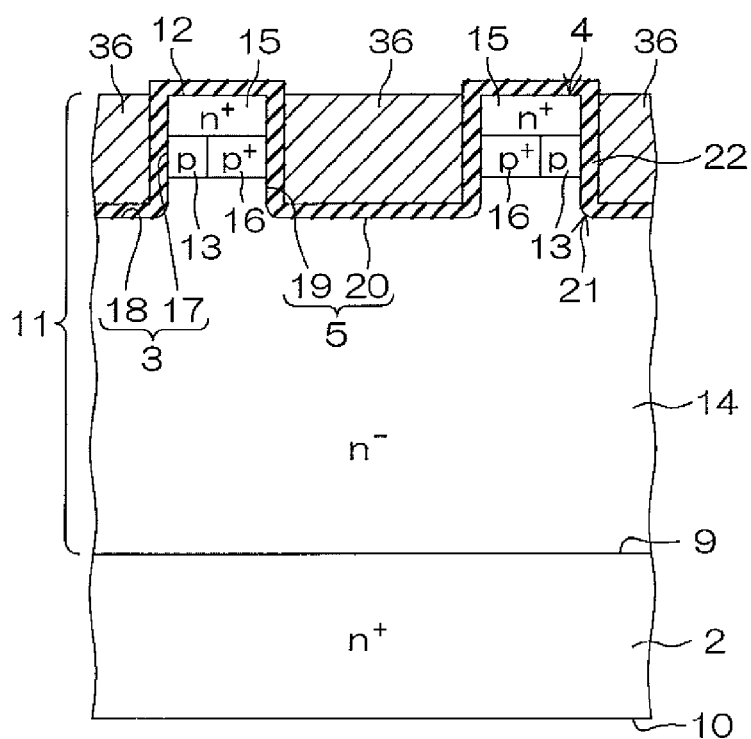
FIG. 7I is a diagram showing a step subsequent to the step of FIG. 7H.
Figure 7J:
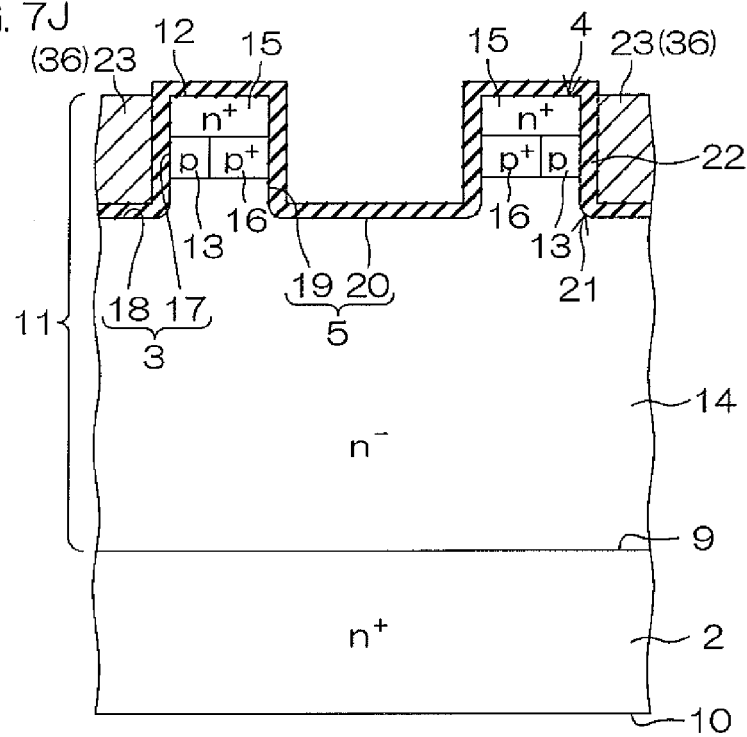
FIG. 7J is a diagram showing a step subsequent to the step of FIG. 7I.
Figure 7K:
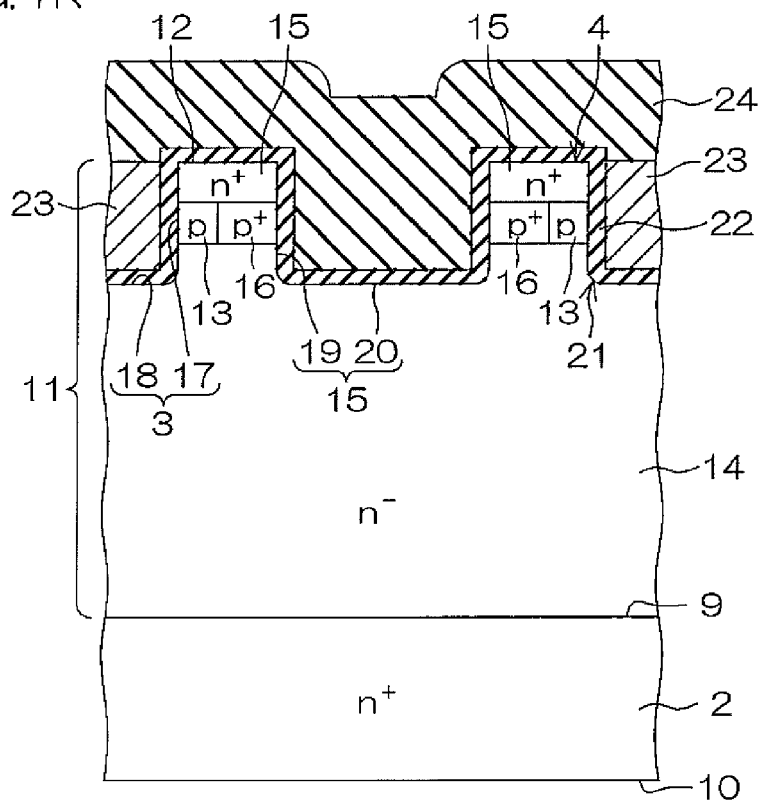
FIG. 7K is a diagram showing a step subsequent to the step of FIG. 7J.

The source electrode 26 is not necessarily required to have the layered structure including the polysilicon layer 27, the intermediate layer 28 and the metal layer 29, but may include a metal layer alone as in a source electrode 38 of a field effect transistor 37 shown in FIG. 4. In this case, a material selected from the group consisting of Ni, Ti, Mo, W and Pt is preferably used for the metal layer. Further, it is preferred to provide a Ni silicide layer between the metal layer 29 and the source region 15 and between the metal layer 29 and the body contact region 16. Thus, the source electrode 38 forms an ohmic junction with respect to the source region 15, while forming a Schottky junction with respect to the drift region 14 to provide a junction barrier (e.g., a junction barrier potential of 0.5 eV to 1.5 eV) lower than the diffusion potential of the body diode 32.

The source trench 5 may have a greater depth than the gate trench 3 as in a field effect transistor 39 shown in FIG. 5. This further alleviates the electric field applied to the opposite edge corner portions 21 of the bottom of the gate trench 3. Since a depthwise middle portion of the drift region 14 is exposed from the bottom surface 20 of the source trench 5, a contact area between the polysilicon layer 27 and the drift region 14 can be increased.

The polysilicon layer of the source electrode is not necessarily required to cover the entire front surface of the unit cell 4 exposed in the contact hole 25. In a field effect transistor 40 shown in FIG. 6, for example, a polysilicon layer 42 of a source electrode 41 is provided as the barrier forming layer only in the bottom of the source trench 5 in which the drift region 14 is exposed, whereby only the drift region 14 is covered with the polysilicon layer 42. In this case, the metal layer 44 may be provided on the polysilicon layer 42 with an intermediate layer 43 interposed between the metal layer 44 and the polysilicon layer 42 to be thereby electrically connected to both the body contact region 16 and the source region 15 in the source trench 5. This makes it possible to form ohmic junctions between the metal layer 44 and the body contact region 16 and between the metal layer 44 and the source region 15, while forming a hetero junction between the polysilicon layer 42 and the drift region 14. A material selected from the group consisting of Ni, Ti, Mo, W and Pt, for example, may be used for the metal layer 44. Further, a Ni silicide layer may be provided between the metal layer 44 and the source region 15 and between the metal layer 44 and the body contact region 16.

The field effect transistor 40 shown in FIG. 6 can be produced by a method similar to the production method for the field effect transistor 1 as shown in FIGS. 3A to 3M.

A process sequence from the step of forming the epitaxial layer 11 to the step of forming the contact holes 25 as shown in FIGS. 7A to 7L is performed in the same manner as the process sequence shown in FIGS. 3A to 3L.

Then, as shown in FIG. 7M, a polysilicon material is deposited by a CVD method until the contact holes 25 are filled with the polysilicon material. Thereafter, an n-type or p-type impurity is implanted into the deposited polysilicon material. At this time, conditions for the implantation depend on the type of the impurity, but the acceleration energy, for example, is 10 keV to 100 keV. Thereafter, the polysilicon material is etched to form a polysilicon layer 42. In turn, an RTA (Rapid Thermal Annealing) process is performed, for example, at 1000° C. for 2 minutes, whereby the impurity is diffused in the polysilicon layer 42. Subsequently, a Ni layer is formed on the back surface 10 of the SiC substrate 2, and then an RTA (Raid Thermal Annealing) process is performed at 1000° C. for 2 minutes, whereby the Ni layer is silicided on the back surface 10. In turn, Ti and TiN are deposited in this order on a surface of the polysilicon layer 42 by a sputtering method, an evaporation method or the like, whereby an intermediate layer 43 is formed. Subsequently, a metal such as Al is deposited on a surface of the intermediate layer 43 by a sputtering method, an evaporation method or the like, whereby a metal layer 44 is formed. Thus, a source electrode 41 is formed. Then, Al is deposited on the back surface 10 of the SiC substrate 2 to form a drain electrode 33.

Thereafter, an interlevel insulation film (not shown), a source pad 6, a gate pad 8 and the like are formed, whereby the field effect transistor 40 shown in FIG. 6 is produced.

Figure 8:
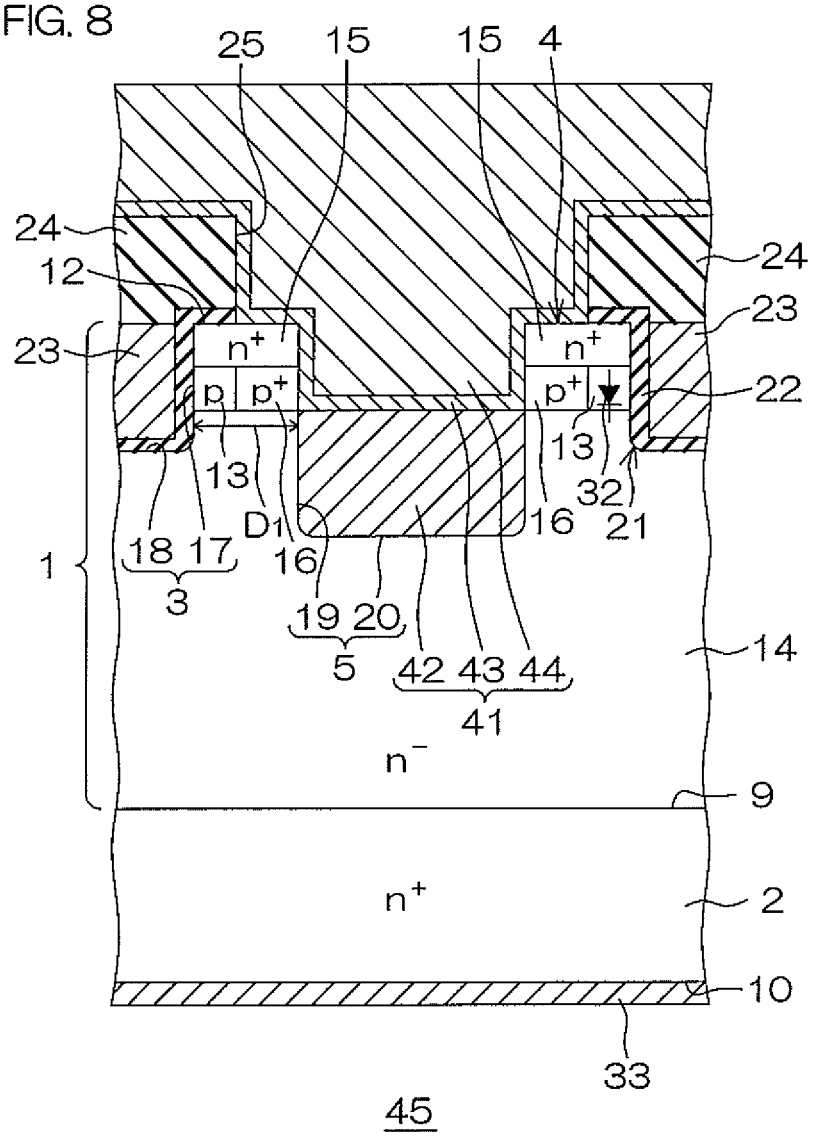
FIG. 8 is a schematic sectional view for explaining a fourth modification of the field effect transistor shown in FIG. 2.

In the arrangement including the source electrode 41, the source trench 5 may have a greater depth than the gate trench 3 as in a field effect transistor 45 as shown in FIG. 8.

Figure 9A:
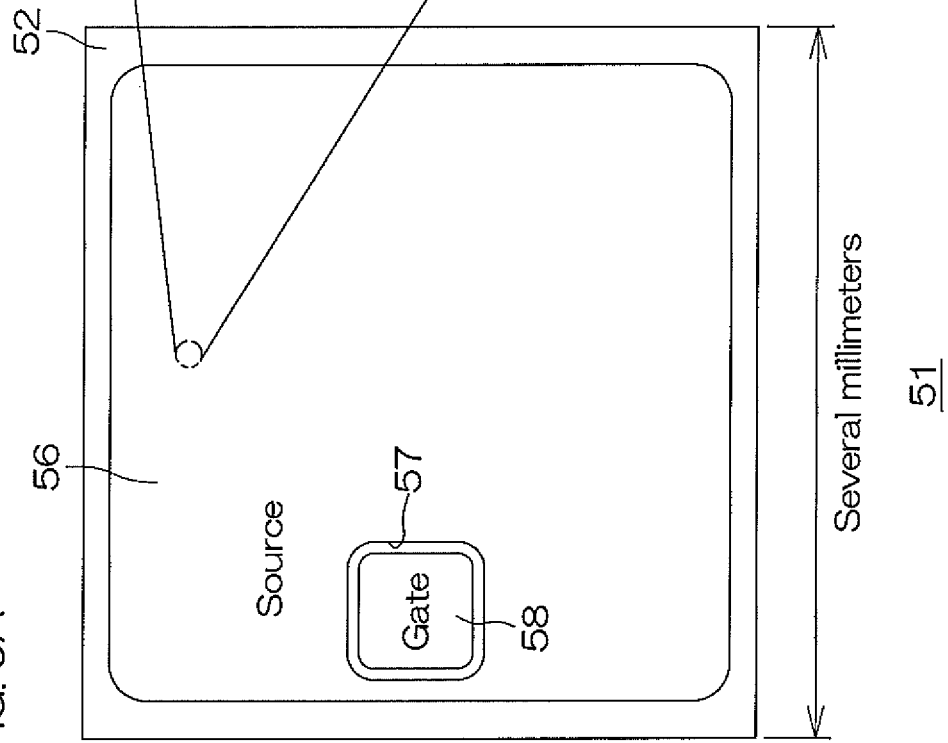
FIGS. 9A and 9B are schematic plan views of a field effect transistor according to a second embodiment of the present invention, particularly, FIG. 9A being an overall view and FIG. 9B being an enlarged internal view.
Figure 9B:
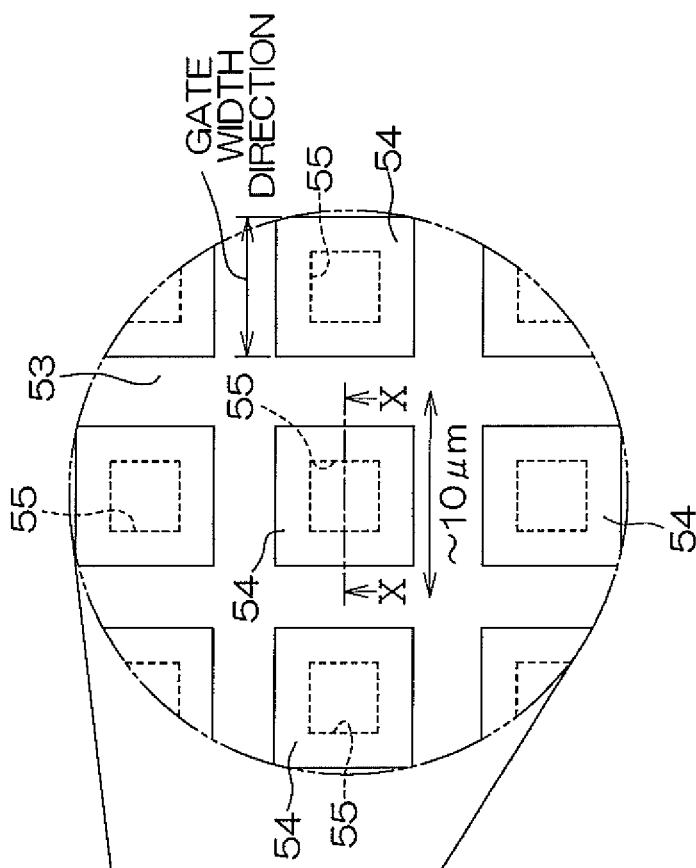

FIGS. 9A and 9B are schematic plan views of a field effect transistor according to a second embodiment of the present invention. Particularly, FIG. 9A is an overall view, and FIG. 9B is an enlarged internal view.

The field effect transistor 51 is a planar gate type power VDMOSFET (discrete device) employing SiC, and is provided, for example, in a chip form having a square plan shape. The chip-form field effect transistor 51 has vertical and lateral dimensions of several millimeters as seen on a paper surface of FIG. 9A.

The field effect transistor 51 includes a SiC substrate 52, and a multiplicity of unit cells 54 defined by a gate electrode 53 having a lattice shape as seen in plan. That is, the unit cells 54, which each have a square plan shape, are arranged in a matrix array on the SiC substrate 52 so as to be respectively located in windows of the lattice-shaped gate electrode 53. The unit cells 54 each have vertical and lateral dimensions of not greater than 10 μm as seen on a paper surface of FIG. 9B, and each include a square source trench 55 provided at a center thereof as extending downward from a front surface thereof toward the SiC substrate 52, as seen in plan.

A source pad 56 is provided on a front surface of the field effect transistor 51. The source pad 56 has a generally square shape having four corners rounded outward as seen in plan, and covers the generally entire front surface of the field effect transistor 51. The source pad 56 has a generally square absent region 57 provided adjacent a middle portion of one edge thereof as seen in plan. The absent region 57 is a region in which the source pad 56 is not present.

A gate pad 58 is disposed in the absent region 57. The gate pad 58 and the source pad 56 are spaced from each other, and isolated from each other.

FIG. 10 is a schematic sectional view of the field effect transistor taken along a section line X-X in FIG. 9B according to the second embodiment of the present invention.

Referring to FIG. 10, the sectional structure of the field effect transistor 51 will be described. The field effect transistor 51 includes a SiC substrate 52 of an n+-type (for example, having a concentration of $1\times10^{18}$ to $1\times10^{21}$ cm$^{-3}$). In this embodiment, the SiC substrate 52 serves as a drain of the transistor 51, and has a front surface 59 (upper surface) defined by a Si plane and a back surface 60 (lower surface) defined by a C plane.

A SiC epitaxial layer 61 of an n−-type having a lower concentration than the SiC substrate 52 (for example, having a concentration of $1\times10^{15}$ to $1\times10^{17}$ cm$^{-3}$) is provided on the SiC substrate 52. The epitaxial layer 61 is formed as a SiC semiconductor layer on the SiC substrate 52 by so-called epitaxial growth. The epitaxial layer 61 to be formed on the front surface 59 (Si plane) is grown with the Si plane defined as a major growth plane. Therefore, the front surface 62 of the epitaxial layer 61 formed by the growth is a Si plane like the front surface 59 of the SiC substrate 52.

The epitaxial layer 61 includes a multiplicity of p-type body regions 63 provided in a well form in a portion thereof adjacent to the front surface 62 (Si plane side) as each having a concentration of $1\times10^{16}$ to $1\times10^{19}$ cm$^{-3}$, and arranged in a matrix array. A portion of the epitaxial layer 61 extending from the body regions 63 to the SiC substrate 52 (C plane side) serves as an n−-type drift region 64 which is maintained as it is after the epitaxial growth.

The body regions 63 each include an n+-type source region 65 (for example, having a concentration of $1\times10^{18}$ to $1\times10^{21}$ cm$^{-3}$) and a p+-type body contact region 66 (for example, having a concentration of $1\times10^{18}$ to $1\times10^{21}$ cm$^{-3}$) surrounded by the source region 65.

Source trenches 55 are provided in the same number as the body regions 63 as extending through the respective body contact regions 66. A lattice-shaped gate electrode 53 covers adjacent pairs of body regions 63. Thus, a multiplicity of unit cells 54 each functioning as a field effect transistor are provided in the epitaxial layer 61. In each of the unit cells 54, the body contact region 66 surrounds the source trench 55, and the body region 63 surrounds the body contact region 66. A gate length is measured along the depth of the source trench 55, while a gate width is measured along a peripheral edge of the unit cell 54 perpendicularly to the gate length.

The source trenches 55 each extend from the front surface 62 of the epitaxial layer 61 to the drift region 64 through the body region 63. The drift region 64 is exposed in bottoms of the source trenches 55. Opposite edge corner portions of the bottom of each of the source trenches 55 opposed to each other perpendicularly to the gate width (in a direction in which each two adjacent unit cells 54 are opposed) are rounded toward the drift region 64. Thus, the source trenches 55 each have a U-sectional shape which is defined by opposed side surfaces 67 and a bottom surface 68 connected by rounded surfaces.

A gate insulation film 69 is provided between the gate electrode 53 and the epitaxial layer 61. The gate electrode 53 extends between the source region 65 and the drift region 64 to control formation of an inversion layer (channel) in a surface of the body region 63. The gate insulation film 69 is a nitrogen-containing oxide film such as a silicon nitride oxide film formed, for example, by thermal oxidation employing a gas containing nitrogen and oxygen. The gate insulation film 69 has a nitrogen content (nitrogen concentration) of, for example, 0.1 to 10%. Thus, vertical MIS transistor structures are each provided, in which the source region 65 and the drift region 64 are spaced from each other vertically and perpendicularly to the front surface 62 (major surface) of the epitaxial layer 61 by the body region 63.

An interlevel insulation film 70 of $SiO_2$ is provided over the epitaxial layer 61 as covering the gate electrode 53. Contact holes 71 each having substantially the same diameter as the source trenches 55 are provided at center portions of the respective body regions 63 in the interlevel insulation film 70 and the gate insulation film 69. Thus, the entire source trenches 55 (i.e., the side surfaces 67 and the bottom surfaces 68 of the source trenches 55) are respectively exposed in the contact holes 71.

A source electrode 72 is provided on the interlevel insulation film 70. The source electrode 72 fills the source trenches 55 of the respective unit cells 54 via the respective contact holes 71 to contact the drift region 64, the body contact regions 66 and the source regions 65 in this order from the bottoms of the source trenches 5. That is, the source electrode 72 is a common interconnection to be shared by all the unit cells 54. Another interlevel insulation film (not shown) is provided on the source electrode 72. The source electrode 72 is electrically connected to the source pad 56 (see FIG. 9A) via the interlevel insulation film (not shown). On the other hand, a gate pad 58 (see FIG. 9A) is electrically connected to the gate electrode 53 through a gate interconnection (not shown) routed on the interlayer insulation film (not shown).

The source electrode 72 includes a polysilicon layer 73, an intermediate layer 74 and a metal layer 75 provided in this order from a portion thereof contacting the epitaxial layer 61.

The polysilicon layer 73 is a doped layer which is formed by using polysilicon doped with an impurity. For example, the polysilicon layer 73 is a higher concentration doped layer which is doped with an impurity in a high concentration on the order of not less than $1\times10^{15}$ cm$^{-3}$, preferably $1\times10^{19}$ to $1\times10^{21}$ cm$^{-3}$. Examples of the impurity to be used for the formation of the polysilicon layer 73 as the doped layer (including the higher concentration doped layer) include n-type impurities such as N (nitrogen), P(phosphorus) and As (arsenic), and p-type impurities such as Al (aluminum) and B (boron). The polysilicon layer 73 has a thickness of, for example, 5000 Å to 10000 Å.

In this embodiment, the polysilicon layer 73 covers the entire front surfaces of the unit cells 54 exposed in the contact holes 71, and contacts the drift region 64, the body contact regions 66 and the source regions 65 in the source trenches 55.

That is, the polysilicon layer 73 includes first portions 76 which each contact the body contact region 66 (higher concentration impurity region) and the source region 65 on the side surface 67 of the source trench 55, and second portions 77 which each serve as a barrier forming layer contacting the lower concentration drift region 64 on the side surface 67 and the bottom surface 68. The first portions 76 of the polysilicon layer 73 each form ohmic junctions with respect to the body contact region 66 and the source region 65. On the other hand, the second portions 77 each form a hetero junction with respect to the lower concentration drift region 64 to provide a junction barrier (e.g., a junction barrier potential of 1 eV to 1.5 eV) lower than the diffusion potential (e.g., 2.8 eV to 3.2 eV) of a body diode 78 (a pn diode defined by a junction between the body region 63 and the drift region 64) present in the field effect transistor 51.

The intermediate layer 74 is a metal layer provided on the polysilicon layer 73, and has a single layer structure including a Ti (titanium)-containing layer or has a layered structure including a plurality of layers including a Ti-containing layer. The Ti-containing layer may be made of Ti, TiN (titanium nitride) or the like. The intermediate layer 74 has a thickness of, for example, 200 nm to 500 nm.

The metal layer 75 is provided on the intermediate layer 74, and exemplary materials for the metal layer 75 include Al (aluminum), Au (gold), Ag (silver), Cu (copper) and Mo (molybdenum), alloys of any of these metals, and metal materials containing any of these metals. The metal layer 75 preferably includes a Mo layer. The metal layer 75 defines the outermost layer of the source electrode 72. The metal layer 75 has a thickness of, for example, 1 μm to 5 μm.

In this embodiment, the combination of the polysilicon layer 73, the intermediate layer 74 and the metal layer 75 provides a layered structure (Poly-Si/Ti/TiN/Al) including a Poly-Si layer (polysilicon layer 73), a Ti layer (intermediate layer 74), a TiN layer (intermediate layer 74) and an Al layer (metal layer 75) which are stacked in this order. In addition, the metal layer 75 preferably includes a Mo sublayer. Since Mo has a higher melting point, the provision of the Mo sublayer in the metal layer 75 substantially prevents the metal layer 75 from being melted to be damaged by heat generated when high current flows through the source electrode 72.

A drain electrode 79 covers the entire back surface 60 of the SiC substrate 52. The drain electrode 79 is a common electrode shared by all the unit cells 54. For example, the drain electrode 79 has a layered structure (Ni silicide/Al) including a Ni silicide layer and an Al layer stacked in this order from the SiC substrate 52.

FIGS. 11A to 11L are schematic sectional views for explaining a method of producing the field effect transistor shown in FIG. 10.

Figure 11A:
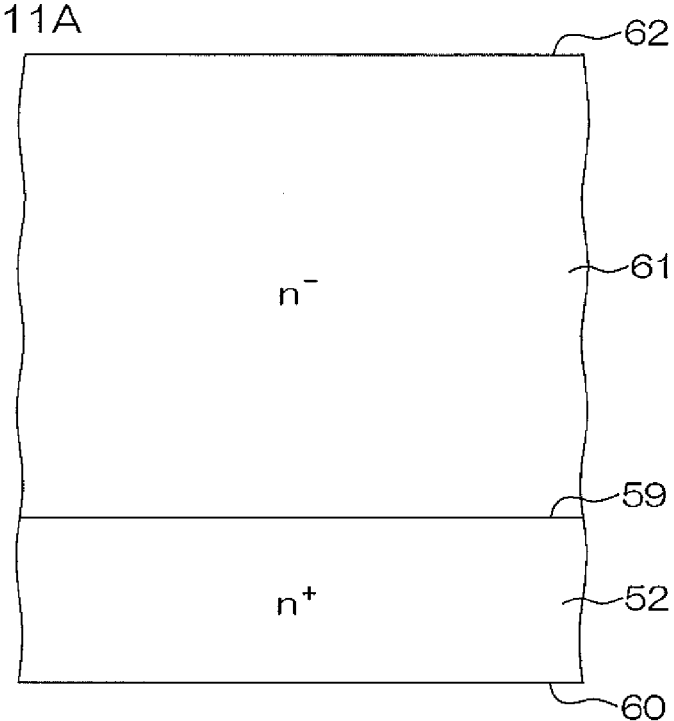
FIG. 11A is a schematic sectional view for explaining a method of producing the field effect transistor shown in FIG. 10.

As shown in FIG. 11A, SiC crystal is first grown on a front surface 59 (Si plane) of a SiC substrate 52 by an epitaxial growth method such as a CVD (Chemical Vapor Deposition) method, an LPE (Liquid Phase Epitaxy) method or an MBE (Molecular Beam Epitaxy) method, while being doped with an impurity. Thus, an n$^-$-type epitaxial layer 61 is formed on the SiC substrate 52.

Figure 11B:
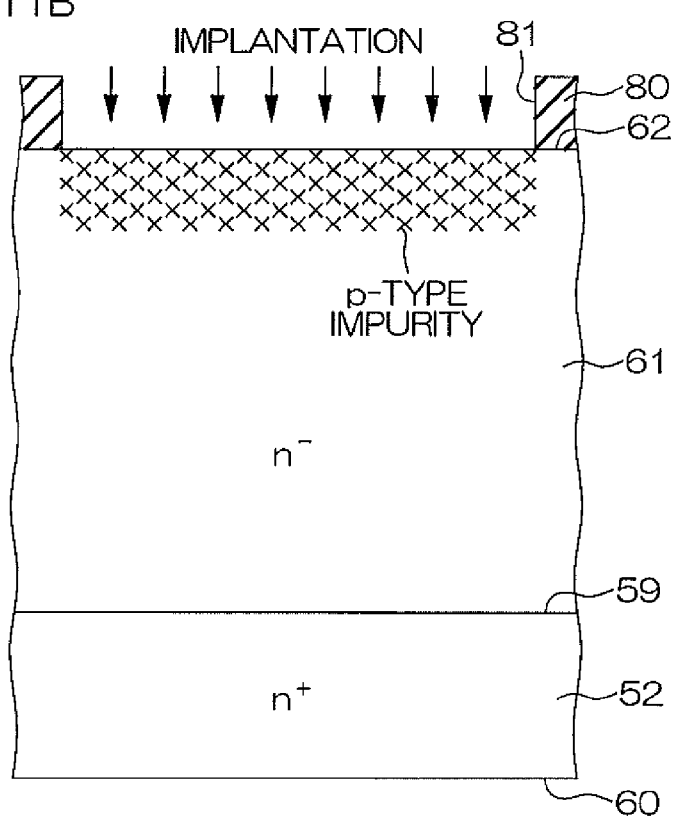
FIG. 11B is a diagram showing a step subsequent to the step of FIG. 11A.

In turn, as shown in FIG. 11B, a mask 80 of SiO$_2$ is formed on the epitaxial layer 61 by a CVD method. In turn, the mask 80 is etched via a photoresist (not shown) to be patterned into a pattern having openings 81 on regions of the epitaxial layer 61 to be formed with body regions 63. After the formation of the openings 81, a p-type impurity is implanted into the epitaxial layer 61 from a front surface 62 of the epitaxial layer 61. At this time, conditions for the implantation depend on the type of the p-type impurity, but the acceleration energy, for example, is 200 keV to 3000 keV. After the implantation of the p-type impurity, the mask 80 is removed.

Figure 11C:
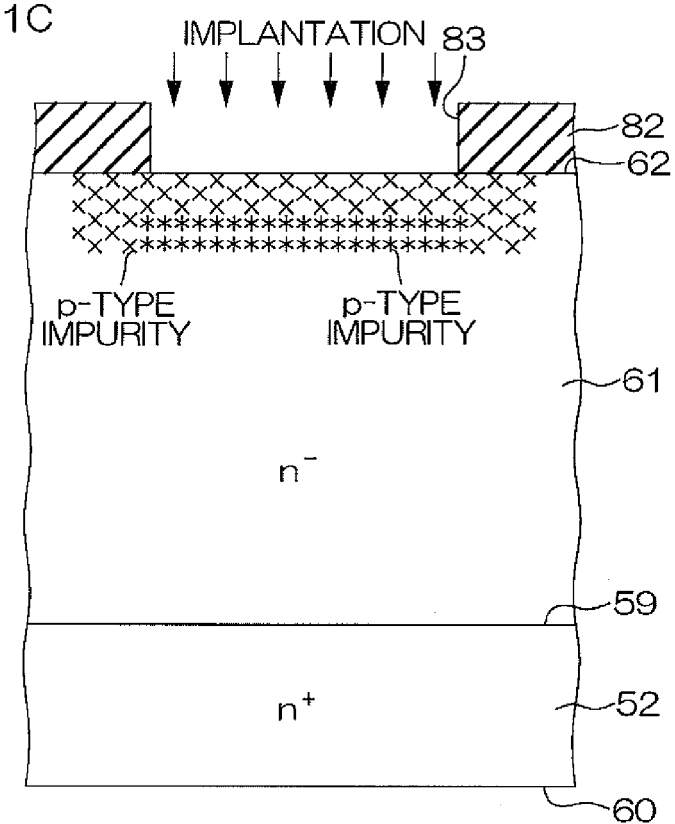
FIG. 11C is a diagram showing a step subsequent to the step of FIG. 11B.

Then, as shown in FIG. 11C, a mask 82 of SiO$_2$ is formed on the epitaxial layer 61 by a CVD method. In turn, the mask 82 is etched via a photoresist (not shown) to be patterned into a pattern having openings 83 on regions of the epitaxial layer 61 to be formed with source regions 65. After the formation of the openings 83, a p-type impurity is implanted into the epitaxial layer 61 from the front surface 62 of the epitaxial layer 61. At this time, conditions for the implantation depend on the type of the p-type impurity, but the acceleration energy, for example, is 30 keV to 400 keV. After the implantation of the p-type impurity, the mask 82 is removed.

Figure 11D:
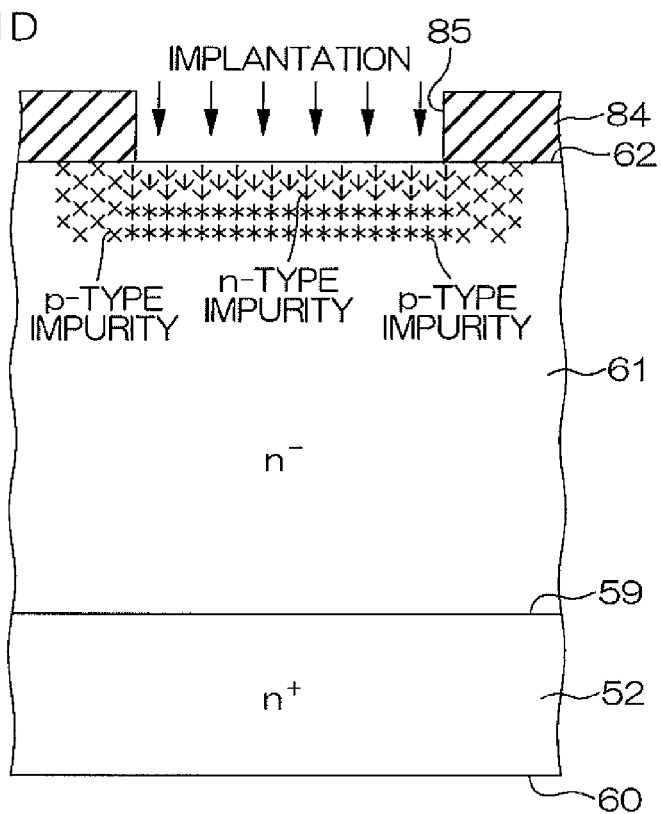
FIG. 11D is a diagram showing a step subsequent to the step of FIG. 11C.

Subsequently, as shown in FIG. 11D, a mask 84 of SiO$_2$ is formed on the epitaxial layer 61 by a CVD method. In turn, the mask 84 is etched via a photoresist (not shown) to be patterned into a pattern having openings 85 on regions of the epitaxial layer 61 to be formed with body contact regions 66. After the formation of the openings 85, an n-type impurity is implanted into the epitaxial layer 61 from the front surface 62 of the epitaxial layer 61. At this time, conditions for the implantation depend on the type of the n-type impurity, but the acceleration energy, for example, is 30 keV to 400 keV. After the implantation of the n-type impurity, the mask 84 is removed.

Figure 11E:
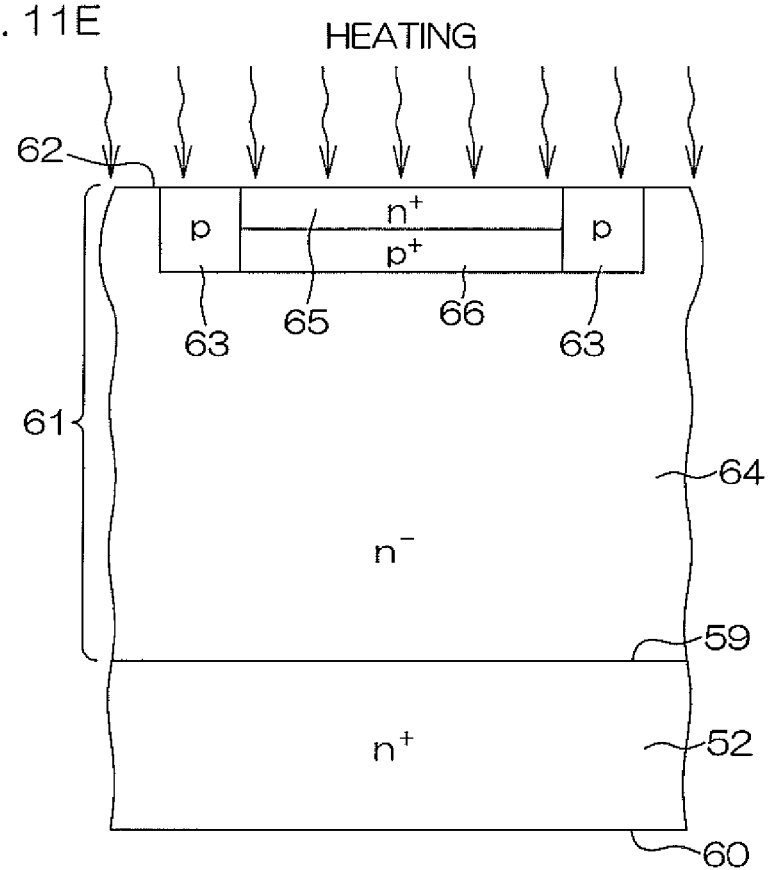
FIG. 11E is a diagram showing a step subsequent to the step of FIG. 11D.

In turn, as shown in FIG. 11E, the epitaxial layer 61 is heat-treated, for example, at 1400° C. to 2000° C. Thus, ions of the n-type and p-type impurities implanted in a surface portion of the epitaxial layer 61 are activated, whereby the body regions 63, the source regions 65 and the body contact regions 66 are formed in the corresponding implantation regions. A base portion of the epitaxial layer 61 serves as a drift region 64 which is maintained as it is after the epitaxial growth. The heat treatment of the epitaxial layer 61 is performed by properly controlling the temperature of a resistance heating furnace or a radio frequency induction heating furnace.

Figure 11F:
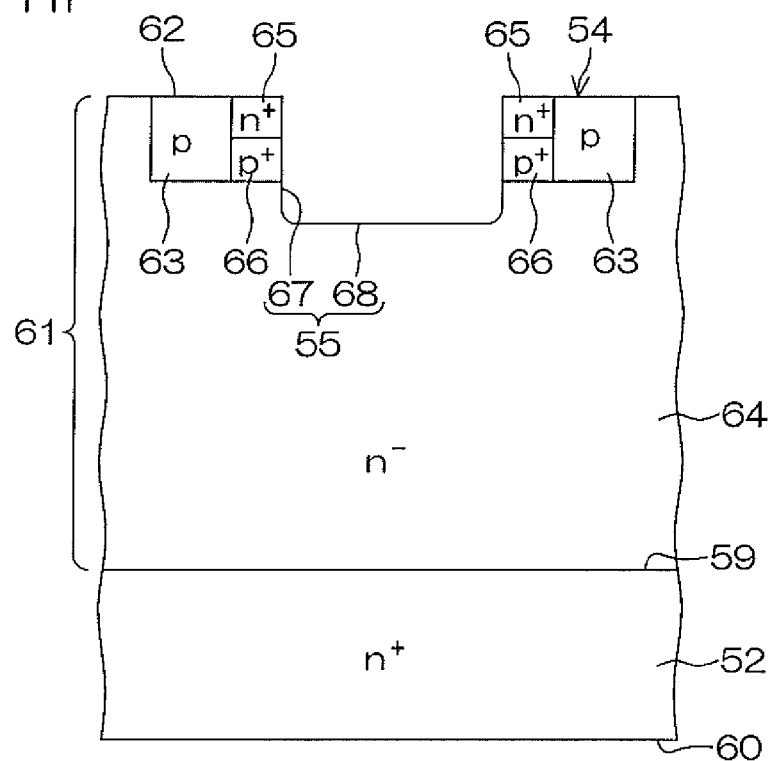
FIG. 11F is a diagram showing a step subsequent to the step of FIG. 11E.

Subsequently, as shown in FIG. 11F, the epitaxial layer 61 is etched by using a mask having openings on regions of the epitaxial layer 11 to be formed with source trenches 55. Thus, the epitaxial layer 61 is dry-etched from the front surface 62 (Si plane) thereof, whereby the source trenches 55 are simultaneously formed. Thus, a multiplicity of unit cells 54 are formed in the epitaxial layer 61. Exemplary etching gases to be herein used include a gas mixture (SF$_6$/O$_2$ gas) containing SF$_6$ (hexafluorosulfur) and O$_2$ (oxygen), and a gas mixture (SF$_6$/O$_2$/HBr gas) containing SF$_6$ (hexafluorosulfur), O$_2$ (oxygen) and HBr (hydrogen bromide).

Figure 11G:
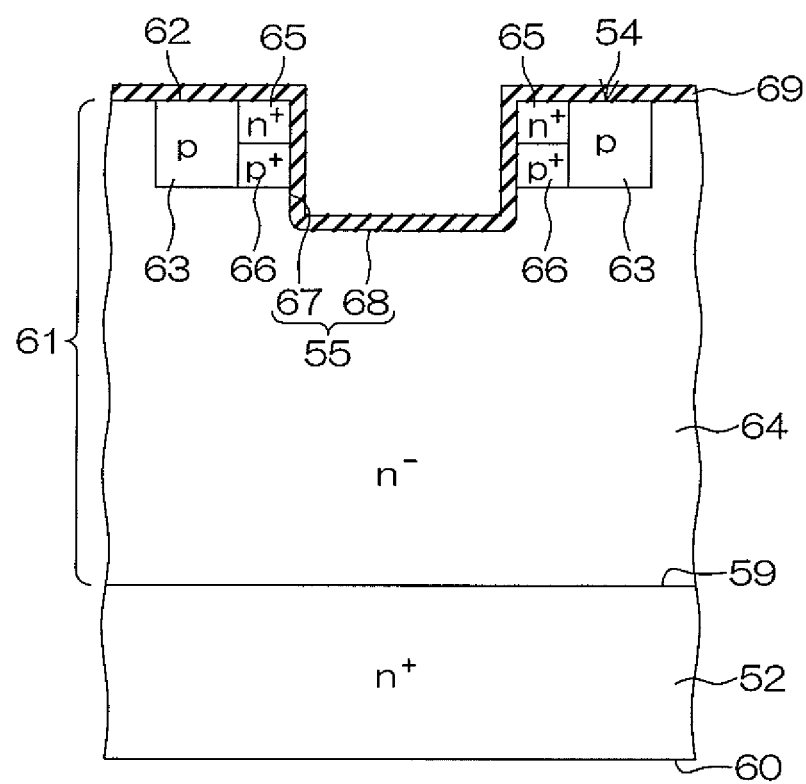
FIG. 11G is a diagram showing a step subsequent to the step of FIG. 11F.

Then, as shown in FIG. 11G, the front surface 62 of the epitaxial layer 61 is oxidized, whereby a silicon nitride oxide film (gate insulation film 69) is formed over the entire front surface 62.

Figure 11H:
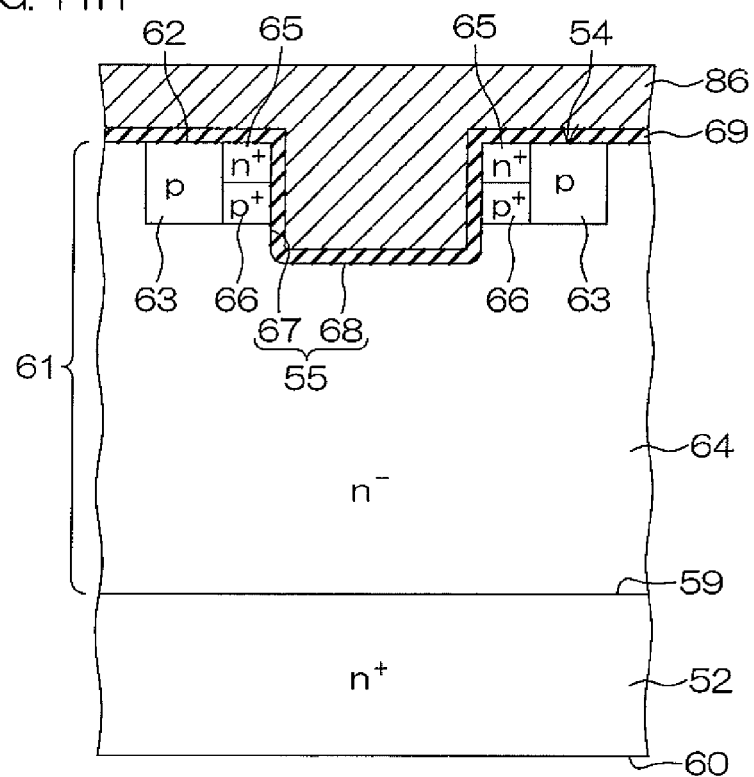
FIG. 11H is a diagram showing a step subsequent to the step of FIG. 11G.

In turn, as shown in FIG. 11H, a doped polysilicon material 86 is deposited from above the epitaxial layer 61 by a CVD method. The deposition of the polysilicon material 86 is continued until at least the source trenches 55 are completely filled with the polysilicon material 86.

Figure 11I:
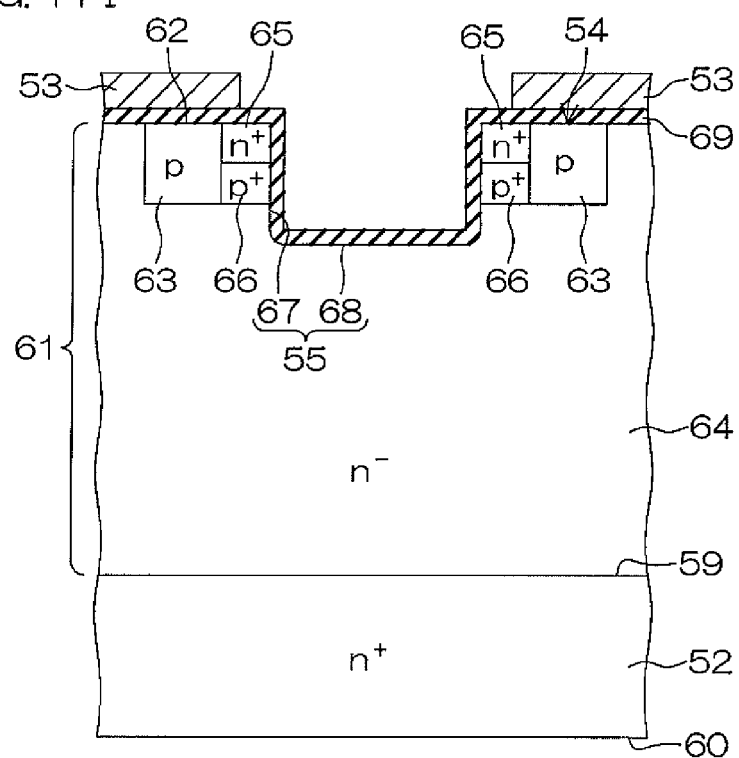
FIG. 11I is a diagram showing a step subsequent to the step of FIG. 11H.

Thereafter, as shown in FIG. 11I, parts of the deposited polysilicon material 86 are removed by dry-etching. Thus, a gate electrode 53 is formed.

Figure 11J:
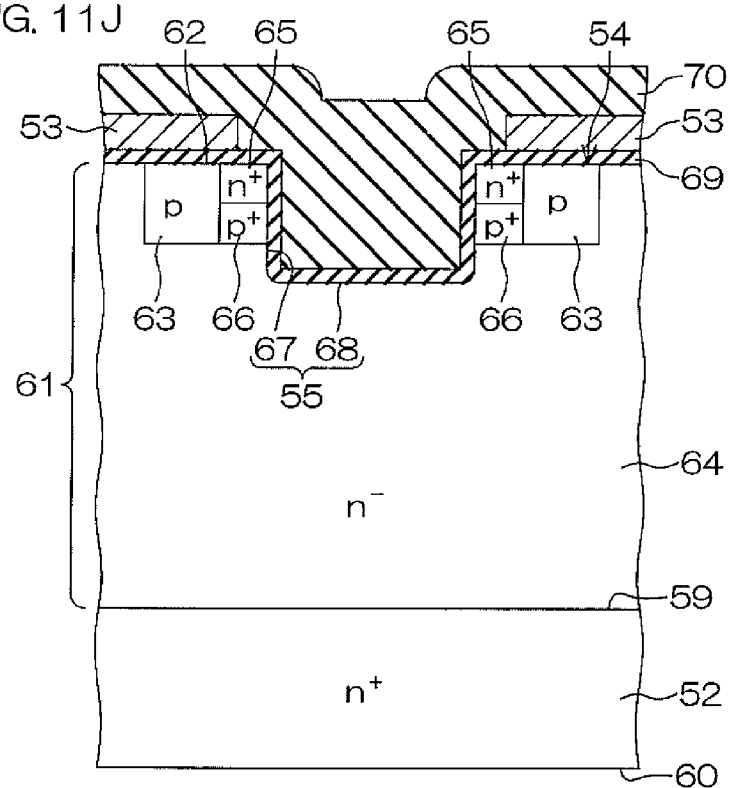
FIG. 11J is a diagram showing a step subsequent to the step of FIG. 11I.

In turn, as shown in FIG. 11J, an interlevel insulation film 70 of $SiO_2$ is formed on the epitaxial layer 61 by a CVD method.

Figure 11K:
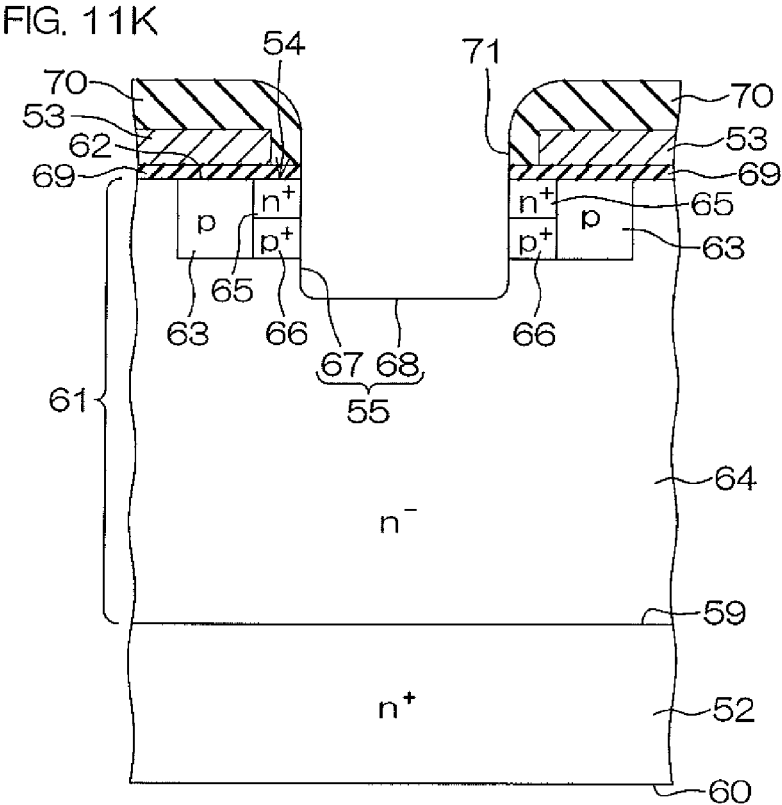
FIG. 11K is a diagram showing a step subsequent to the step of FIG. 11J.

Then, as shown in FIG. 11K, the interlevel insulation film 70 and the gate insulation film 69 are sequentially patterned, whereby contact holes 71 are formed in the interlevel insulation film 70 and the gate insulation film 69.

In turn, as shown in FIG. 11L, a polysilicon material is deposited until the contact holes 71 are completely filled with the polysilicon material. Thereafter, an n-type or p-type impurity is implanted into the deposited polysilicon material. At this time, conditions for the implantation depend on the type of the impurity, but the acceleration energy, for example, is 10 keV to 100 keV. Thereafter, a Ni layer is formed on a back surface 60 of the SiC substrate 52. In turn, an RTA (Rapid Thermal Annealing) process is performed at 1000° C. for 2 minutes. Thus, the impurity in the polysilicon material is diffused, whereby a polysilicon layer 73 is formed and the Ni layer formed on the back surface 60 is silicided. Then, Ti and TiN are deposited in this order on a surface of the polysilicon layer 73, whereby an intermediate layer 74 is formed. In turn, a metal such as Al is deposited on a surface of the intermediate layer 74 by a sputtering method, an evaporation method or the like, whereby a metal layer 75 is formed. Thus, a source electrode 72 is formed. Subsequently, Al is deposited on the back surface 60 of the SiC substrate 52, whereby a drain electrode 79 is formed.

Thereafter, an interlevel insulation film (not shown), a source pad 56, a gate pad 58 and the like are formed, whereby the field effect transistor 51 shown in FIG. 10 is provided.

In the field effect transistor 51, current preferentially flows in the hetero junction between the second portion 77 of the polysilicon layer 73 and the drift region 64 during the OFF period to reduce or eliminate the current flowing through the body diode 78. Thus, the current flowing through the field effect transistor 51 can flow into an electric motor, for example, as return current.

During the OFF period, the current flows into the drift region 64 from the second portion 77 of the polysilicon layer 73 formed in the source trench 55 at the center of each of the unit cells 54, so that carriers hardly migrate between the p-type body region 63 and the n-type drift region 64. This prevents the recombination of the holes and the electrons in the drift region 64. As a result, the extension of the SiC crystal defects of the epitaxial layer 61 can be suppressed, thereby suppressing the increase in the ON resistance of the transistor 51.

Since the source trench 55 simultaneously exposes both the source region 65 and the drift region 64, the polysilicon layer 73 (source electrode 72) formed in the source trench 55 can be brought into contact with both the source region 65 and the drift region 64. Thus, the polysilicon layer 73 of the source electrode 72 forms an ohmic junction with respect to the source region 65, and forms a hetero junction with respect to the drift region 64 to provide a junction barrier lower than the diffusion potential of the body diode 78. Therefore, these junctions can be formed in the step of forming the polysilicon layer 73 (see FIG. 11L) in the production process for the field effect transistor 51.

In addition, the layer provided in contact with the source region 65 and the drift region 64 is made of polysilicon. This makes it possible to form the ohmic junction between the first portion 76 and the higher concentration source region 65 and to form the hetero junction between the second portion 77 and the lower concentration drift region 64 without precisely controlling the annealing temperature in the production process. Without the need for precisely controlling the annealing temperature, the aforementioned two junctions can be simultaneously formed by the deposition of the polysilicon layer 73 and the annealing (see FIG. 11L).

Further, polysilicon ensures excellent step coverage, so that the polysilicon layer 73 can be properly provided in intimate contact with surfaces exposed in the contact hole 71. That is, the polysilicon layer 73 can be properly provided in intimate contact with portions of the source region 65 exposed in the side surfaces 67 of the source trench 55 and portions of the drift region 64 exposed in the side surfaces 67 and the bottom surface 68. As a result, the connection reliability of the source electrode 72 is improved.

Since the impurity concentration of the body contact region 66 provided in contact with the polysilicon layer 73 is $1\times10^{18}$ to $1\times10^{21}$ $cm^{-3}$, the contact resistance between the body region 63 and the polysilicon layer 73 (first portion 76) can be reduced. This suppresses a voltage drop at the junction between the polysilicon layer 73 and the body region 63. Further, the sheet resistance of the body region 63 can be reduced, thereby preventing the operation of a parasitic bipolar transistor (a bipolar transistor defined by the source region 55, the body region 63 and the drift region 64). Further, the impurity concentration of the source region 65 provided in contact with the polysilicon layer 73 is $1\times10^{18}$ to $1\times10^{21}$ $cm^{-3}$, so that the contact resistance between the source region 65 and the polysilicon layer 73 (first portion 76) and the sheet resistance of the source region 65 can be reduced to thereby reduce the ON resistance of the transistor. As a result, a transistor operation can be properly performed.

Since the polysilicon layer 73 has a high impurity concentration on the order of $1\times10^{19}$ to $1\times10^{21}$ $cm^{-3}$, the junction barrier between the polysilicon layer 73 and the body region 63 (body contact region 66) can be sufficiently increased. As a result, a leak current between the polysilicon layer 73 and the drift region 64 can be suppressed.

The combination of the polysilicon layer 73, the intermediate layer 74 and the metal layer 75 of the source electrode 72 provides the layered structure (Poly-Si/Ti/TiN/Al) including a Poly-Si layer (polysilicon layer 73), a Ti layer (intermediate layer 74), a TiN layer (intermediate layer 74) and an Al layer (metal layer 75) which are stacked in this order. Since the Ti-containing intermediate layer 74 has excellent adhesion to both the polysilicon and the metal material, the aforementioned layered structure improves the adhesion between the polysilicon layer 73 and the metal layer 75. As a result, the connection reliability of the source electrode 72 can be improved.

Further, the TiN layer is disposed between the polysilicon layer 73 and the metal layer 75 (Al layer), the TiN layer serves as a barrier layer which prevents the diffusion of Al from the metal layer 75 into the polysilicon layer 73. Thus, an excess amount of Al is prevented from diffusing into the polysilicon layer 73, thereby stabilizing the impurity concentration of the polysilicon layer 73. As a result, the resistance value of the polysilicon layer 73 can be stabilized.

The source electrode 72 is not necessarily required to have the layered structure including the polysilicon layer 73, the intermediate layer 74 and the metal layer 75, but may include a metal layer alone, like a source electrode 88 of a field effect transistor 87 shown in FIG. 12. In this case, a material selected from the group consisting of Ni, Ti, Mo, W and Pt is preferably used for the metal layer. Further, it is preferred to provide a Ni silicide layer between the metal layer and the source region 65 and between the metal layer and the body contact region 66. Thus, the source electrode 88 forms an ohmic junction with respect to the source region 65, while forming a Schottky junction with respect to the drift region 64 to provide a junction barrier (e.g., a junction barrier potential of 0.5 eV to 1.5 eV) lower than the diffusion potential of the body diode 78.

As in a field effect transistor 89 shown in FIG. 13, the source trench 55 may have a depth such that a part of the drift region 64 extending to a depthwise middle portion is exposed from the bottom surface 68 of the source trench 55. Thus, a contact area between the polysilicon layer 73 and the drift region 64 can be increased.

The polysilicon layer of the source electrode is not necessarily required to cover the entire front surface of the unit cell 54 exposed in the contact hole 71. In a field effect transistor 90 shown in FIG. 14, for example, a polysilicon layer 92 of a source electrode 91 is provided as a barrier forming layer only in the bottom of the source trench 55 in which the drift region 64 is exposed, whereby only the drift region 64 is covered with the polysilicon layer 92. In this case, the metal layer 94 may be provided on the polysilicon layer 92 with an intermediate layer 93 interposed between the metal layer 94 and the polysilicon layer 92 to be thereby electrically connected to both the body contact region 66 and the source region 65 in the source trench 55. This makes it possible to form ohmic junctions between the metal layer 94 and the body contact region 66 and between the metal layer 94 and the source region 65, while forming a hetero junction between the polysilicon layer 92 and the drift region 64. A material selected from the group consisting of Ni, Ti, Mo, W and Pt, for example, may be used for the metal layer 94. Further, a Ni silicide layer may be provided between the metal layer 94 and the epitaxial layer 61.

While embodiments of the present invention have thus been described, the present invention may be embodied in other ways.

In the field effect transistors described above, for example, the conductivity types of the semiconductor portions may be reversed. In the field effect transistor 1, the p-type portions may be of the n-type, and the n-type portions may be of the p-type.

In the embodiments described above, only the vertical VDMOSFETs (the trench gate type and the planar gate type) are employed as examples of the present invention. The present invention is applicable to an LDMOSFET (Lateral Double-diffused MOSFET) in which drain current flows laterally parallel to a major surface of a SiC substrate.

The SiC field effect transistor of the present invention can be incorporated in a power module to be used in an invertor circuit which is employed as a drive circuit for driving an electric motor for use as a power source for an electric vehicle (including a hybrid car), an electric train, an industrial robot or the like. Further, the SiC field effect transistor of the present invention can be incorporated in a power module to be used in an invertor circuit which converts electric power generated by a solar battery, a wind power generator or other power generator (particularly, a domestic power generator) so as to compatibilize the electric power with commercial electric power.

It should be understood that the embodiments of the present invention are merely illustrative of the technical principles of the present invention but not limitative of the invention. The spirit and scope of the present invention are to be limited only by the appended claims.

Elements described in the embodiments of the present invention may be combined with each other within the scope of the present invention.

This application corresponds to Japanese Patent Application No. 2009-293363 filed in the Japan Patent Office on Dec. 24, 2009, the disclosure of which is incorporated herein by reference in its entirety.

REFERENCE SIGNS LIST

1 Field effect transistor, 3 Gate trench, 5 Source trench, 11 Epitaxial layer, 12 Front surface (of epitaxial layer), 13 Body region, 14 Drift region, 15 Source region, 17 Side surface (of gate trench), 19 Side surface (of source trench), 22 Gate insulation film, 23 Gate electrode, 26 Source electrode, 27 Polysilicon layer, 28 Intermediate layer, 29 Metal layer, 30 First portion, 31 Second portion, 32 Body diode, 37 Field effect transistor, 38 source electrode, 39 Field effect transistor, 40 Field effect transistor, 41 Source electrode, 42 Polysilicon layer, 43 Intermediate layer, 44 Metal layer, 45 Field effect transistor, 51 Field effect transistor, 53 Gate electrode, 55 Source trench, 61 Epitaxial layer, 62 Front surface (of epitaxial layer), 63 body region, 64 Drift region, 65 Source region, 69 Gate insulation film, 72 Source electrode, 73 Polysilicon layer, 74 Intermediate layer, 75 Metal layer, 76 First portion, 77 Second portion, 78 Third portion body diode, 87 Field effect transistor, 88 Source electrode, 89 Field effect transistor, 90 Field effect transistor, 91 Source electrode, 92 Polysilicon layer, 93 Intermediate layer, 94 Metal layer.

The invention claimed is:

1. A SiC field effect transistor comprising:
   a SiC semiconductor layer; and
   a Metal Insulator Semiconductor (MIS) transistor structure including
      a source region of a first conductivity type provided in the SiC semiconductor layer,
      a body region of a second conductivity type provided in the SiC semiconductor layer in contact with the source region,
      a drift region of the first conductivity type provided in the SiC semiconductor layer in contact with the body region,
      a gate insulation film,
      a gate electrode opposed to the body region with the gate insulation film interposed between the gate electrode and the body region for forming a channel in the body region to cause electric current to flow between the drift region and the source region, and
      a barrier forming layer provided directly in contact with the drift region to form a junction barrier by the contact with the drift region, the barrier forming layer further being in direct contact with the source region,
   wherein the MIS transistor structure includes a vertical MIS transistor structure in which the source region and the drift region are spaced from each other vertically and perpendicularly to a major surface of the SiC semiconductor layer with the body region interposed therebetween,
   wherein the vertical MIS transistor structure further includes:
   a source trench extending from the major surface of the SiC semiconductor layer to the drift region through the source region and the body region; and
   a source electrode provided in contact with the source region, the body region and the drift region in the source trench with the barrier forming layer being disposed in a portion of the source electrode contacting the drift region.

2. The SiC field effect transistor according to claim 1, wherein the barrier forming layer is made of polysilicon and forms a hetero junction with respect to the drift region.

3. The SiC field effect transistor according to claim 1, wherein the barrier forming layer is made of a material selected from the group consisting of Ni, Ti, Mo, W and Pt and forms a Schottky junction with respect to the drift region.

4. The SiC field effect transistor according to claim 1,
wherein the source electrode includes a polysilicon layer provided in contact with each of the source region, the body region and the drift region,
wherein the polysilicon layer includes
a first portion which forms an ohmic junction with respect to the source region, and
a second portion which serves as the barrier forming layer to form a hetero junction with respect to the drift region.

5. The SiC field effect transistor according to claim 4, wherein the body region has an impurity concentration of not less than $1 \times 10^{16}$ cm$^{-3}$.

6. The SiC field effect transistor according to claim 4, wherein the source region has an impurity concentration of not less than $1 \times 10^{18}$ cm$^{-3}$.

7. The SiC field effect transistor according to claim 4,
wherein the source electrode further includes a metal layer provided on the polysilicon layer,
wherein the metal layer includes a Ti-containing layer provided in a portion thereof contacting the polysilicon layer.

8. The SiC field effect transistor according to claim 1,
wherein the source electrode includes:
a polysilicon layer provided in contact with the drift region; and
a metal layer provided on the polysilicon layer in contact with the source region,
wherein the metal layer forms an ohmic junction with respect to the source region,
wherein the polysilicon layer serves as the barrier forming layer to form a hetero junction with respect to the drift region.

9. The SiC field effect transistor according to claim 4, wherein the polysilicon layer contains at least one impurity selected from the group consisting of N, P, As, Al and B.

10. The SiC field effect transistor according to claim 9, wherein the polysilicon layer has an impurity concentration of not less than $1 \times 10^{15}$ cm$^{-3}$.

11. The SiC field effect transistor according to claim 7, wherein the metal layer has a structure including a Ti sublayer, a TiN sublayer and an Al sublayer stacked in this order from the polysilicon layer.

12. The SiC field effect transistor according to claim 7, wherein the metal layer includes a Mo sublayer.

13. The SiC field effect transistor according to claim 1,
wherein the vertical MIS transistor structure further includes a gate trench extending from the major surface of the SiC semiconductor layer to the drift region through the source region and the body region,
wherein the vertical MIS transistor structure includes a trench gate type structure in which the gate insulation film is disposed on a side surface of the gate trench and the gate electrode is opposed to the body region with the gate insulation film interposed between the gate electrode and the body region.

14. The SiC field effect transistor according to claim 13, wherein the source trench has a greater depth than the gate trench.

15. The SiC field effect transistor according to claim 13, wherein a distance between a side surface of the source trench and the side surface of the gate trench is 0.5 μm to 3 μm.

16. The SiC field effect transistor according to claim 1, wherein the vertical MIS transistor structure includes a planar gate type structure in which the gate insulation film is disposed on the major surface of the SiC semiconductor layer and the gate electrode is opposed to the body region with the gate insulation film interposed between the gate electrode and the body region.

17. The SiC field effect transistor according to claim 5,
wherein the source region has an impurity concentration of not less than $1 \times 10^{18}$ cm$^{-3}$.

18. The SiC field effect transistor according to claim 6,
wherein the source electrode further includes a metal layer provided on the polysilicon layer,
wherein the metal layer includes a Ti-containing layer provided in a portion thereof contacting the polysilicon layer.

19. The SiC field effect transistor according to claim 5,
wherein the source electrode further includes a metal layer provided on the polysilicon layer,
wherein the metal layer includes a Ti-containing layer provided in a portion thereof contacting the polysilicon layer.

* * * * *